(12) United States Patent
Kim et al.

(10) Patent No.: US 12,363,897 B2
(45) Date of Patent: Jul. 15, 2025

(54) SEMICONDUCTOR DEVICE HAVING A THROUGH ELECTRODE PENETRATING MOLD LAYERS FORMED IN AN EXTENSION AREA

(71) Applicant: SAMSUNG ELECTRONICS CO., LTD., Suwon-si (KR)

(72) Inventors: Kihyun Kim, Suwon-si (KR); Youngho Kwon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 718 days.

(21) Appl. No.: 17/036,373

(22) Filed: Sep. 29, 2020

(65) Prior Publication Data

US 2021/0335809 A1 Oct. 28, 2021

(30) Foreign Application Priority Data

Apr. 24, 2020 (KR) .................. 10-2020-0049987

(51) Int. Cl.
| | | |
|---|---|---|
| H01L 27/11582 | (2017.01) | |
| H10B 41/10 | (2023.01) | |
| H10B 41/27 | (2023.01) | |
| H10B 41/40 | (2023.01) | |
| H10B 43/10 | (2023.01) | |
| H10B 43/27 | (2023.01) | |
| H10B 43/40 | (2023.01) | |

(52) U.S. Cl.
CPC ............ *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 41/10; H10B 41/27; H10B 41/40; H10B 43/27; H10B 43/40
See application file for complete search history.

(56) References Cited

U.S. PATENT DOCUMENTS

| | | |
|---|---|---|
| 2016/0343727 A1 | 11/2016 | Kim et al. |
| 2017/0352678 A1 | 12/2017 | Lu et al. |

(Continued)

FOREIGN PATENT DOCUMENTS

| | | |
|---|---|---|
| KR | 10-2016-0136919 A | 11/2016 |
| KR | 10-2019-0085475 A | 7/2019 |
| KR | 10-2020-0008828 A | 1/2020 |

*Primary Examiner* — Anh D Mai
(74) *Attorney, Agent, or Firm* — Fish & Richardson P.C.

(57) ABSTRACT

A semiconductor device includes a substrate including cell array, extension, and through electrode areas; a memory stack on the substrate and including first gate electrodes, insulating layers, and mold layers, the first gate electrodes and the insulating layers being sequentially stacked, and the mold layers including an insulating material and being on the through electrode area at a same level as the first gate electrodes; a channel structure vertically penetrating the first gate electrodes; a through electrode vertically penetrating the mold layers; first isolation insulating layers vertically penetrating the memory stack, extending in a first direction, and being spaced apart from each other in a second direction; and a second isolation insulating layer between the channel structure and the through electrode area and extending in the second direction and vertically penetrating the first gate electrodes, and in plan view, the second isolation insulating layer intersects the first isolation insulating layers.

13 Claims, 33 Drawing Sheets

(56) References Cited

U.S. PATENT DOCUMENTS

| | | |
|---|---|---|
| 2019/0043879 A1 | 2/2019 | Lu et al. |
| 2019/0057974 A1 | 2/2019 | Lu et al. |
| 2019/0067314 A1 | 2/2019 | Lu et al. |
| 2019/0172838 A1 | 6/2019 | Jo et al. |
| 2019/0214404 A1* | 7/2019 | Ahn ................. H01L 29/40117 |
| 2019/0237475 A1 | 8/2019 | Jung et al. |
| 2019/0333872 A1 | 10/2019 | Lim et al. |
| 2020/0027893 A1* | 1/2020 | Yang ................. H01L 21/76831 |

* cited by examiner

FIG. 27
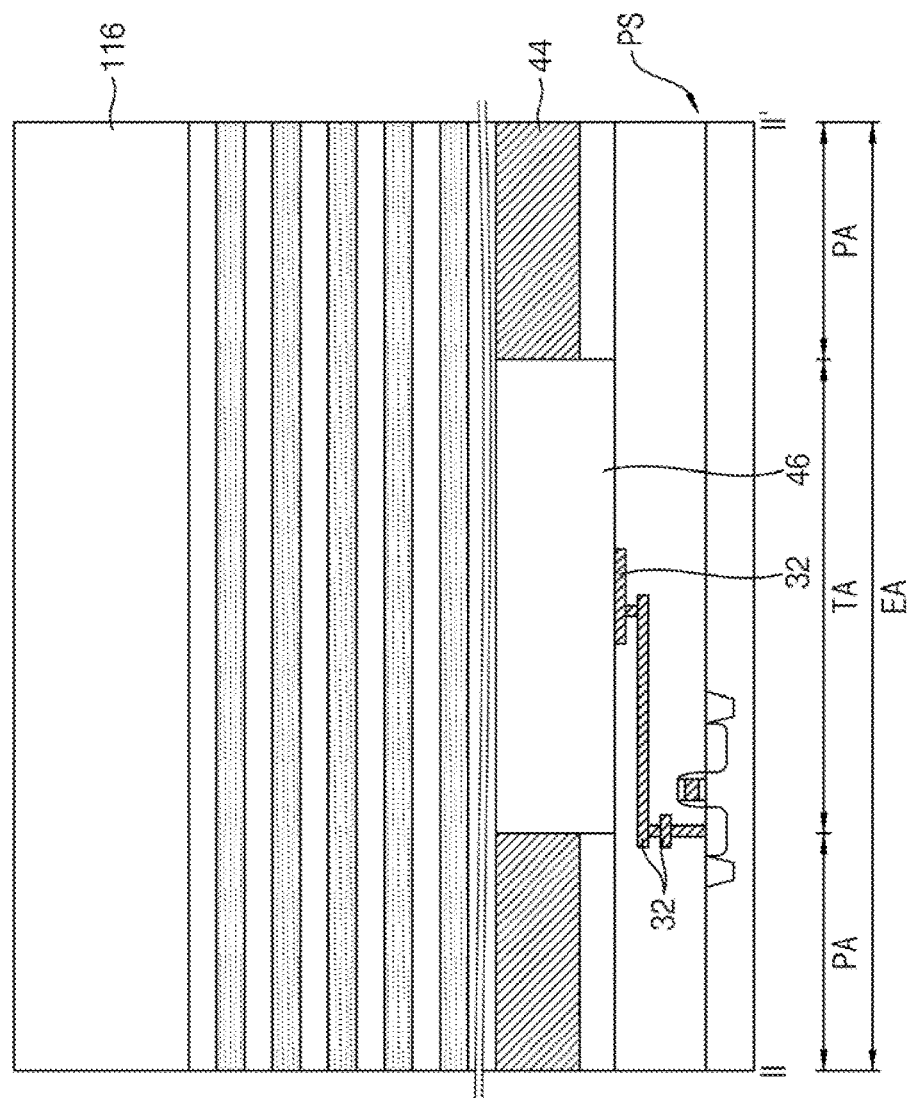
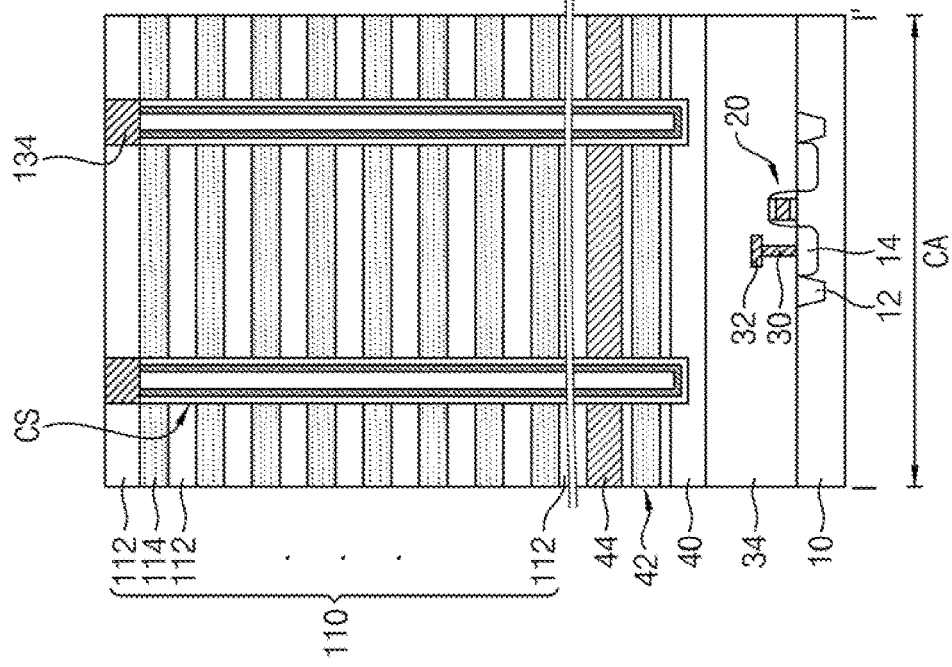

SEMICONDUCTOR DEVICE HAVING A THROUGH ELECTRODE PENETRATING MOLD LAYERS FORMED IN AN EXTENSION AREA

CROSS-REFERENCE TO THE RELATED APPLICATION

Korean Patent Application No. 10-2020-0049987, filed on Apr. 24, 2020, in the Korean Intellectual Property Office, and entitled: "Semiconductor Devices Having Isolation Insulating Layers," is incorporated by reference herein in its entirety.

BACKGROUND

1. Field

Embodiments relate to a semiconductor device having isolation insulating layers.

2. Description of the Related Art

A 3D nonvolatile memory device having a multi-stack structure has been proposed for light, thin, short, and highly integrated electronic products.

SUMMARY

The embodiments may be realized by providing a semiconductor device including a substrate including a cell array area and an extension area, the extension area including a through electrode area; a memory stack on the substrate and including first gate electrodes, insulating layers, and mold layers, the first gate electrodes and the insulating layers being sequentially stacked, and the mold layers including an insulating material and being on the through electrode area at a same level as the first gate electrodes; a channel structure vertically penetrating the first gate electrodes on the cell array area; a through electrode vertically penetrating the mold layers on the through electrode area; first isolation insulating layers vertically penetrating the memory stack and extending in a first horizontal direction, the first isolation insulating layers being spaced apart from each other in a second horizontal direction crossing the first horizontal direction; and a second isolation insulating layer between the channel structure and the through electrode area and extending in the second horizontal direction and vertically penetrating the first gate electrodes, wherein, in a plan view, the second isolation insulating layer intersects the first isolation insulating layers.

The embodiments may be realized by providing a semiconductor device including a substrate including a cell array area and an extension area, the extension area including a through electrode area; a memory stack on the substrate and including first gate electrodes, insulating layers, and mold layers, the first gate electrodes and the insulating layers being sequentially stacked, and the mold layers including insulating material and being on the through electrode area at a same level as the first gate electrodes; a channel structure vertically penetrating the first gate electrodes on the cell array area; a through electrode vertically penetrating the mold layers on the through electrode area; first isolation insulating layers vertically penetrating the memory stack and extending in a first horizontal direction, the first isolation insulating layers being spaced apart from each other in a second horizontal direction crossing the first horizontal direction; and a plurality of second isolation insulating layers between the channel structure and the through electrode area and extending in the second horizontal direction and vertically penetrating the memory stack, wherein, in a plan view, the plurality of second isolation insulating layer are spaced apart from each other in the first horizontal direction and intersect the first isolation insulating layers.

The embodiments may be realized by providing a semiconductor device including a substrate including a cell array area and an extension area, the extension area including a through electrode area; a peripheral circuit structure on the substrate; a memory stack on the peripheral circuit structure, the memory stack including first gate electrodes and mold layers sequentially stacked, and second gate electrodes at the same level as the first gate electrodes; a channel structure vertically penetrating the first gate electrodes on the cell array area; dummy channel structures vertically penetrating the first gate electrodes on the extension area; a through electrode vertically penetrating the mold layers on the through electrode area; first isolation insulating layers vertically penetrating the memory stack and extending in a first horizontal direction, the first isolation insulating layers being spaced apart from each other in a second horizontal direction crossing the first horizontal direction; and a second isolation insulating layer between the channel structure and the through electrode area and extending in the second horizontal direction and vertically penetrating the first gate electrodes, wherein, in a plan view, the second isolation insulating layer intersects the first isolation insulating layers, is between the dummy channel structures, and electrically and spatially separates the first gate electrodes from the second gate electrodes.

BRIEF DESCRIPTION OF THE DRAWINGS

Features will be apparent to those of skill in the art by describing in detail exemplary embodiments with reference to the attached drawings in which:

FIGS. 21 to 35 are plan views and vertical cross-sectional views of stages in a method of manufacturing a semiconductor device according to an example embodiment.

DETAILED DESCRIPTION

Figure 1:
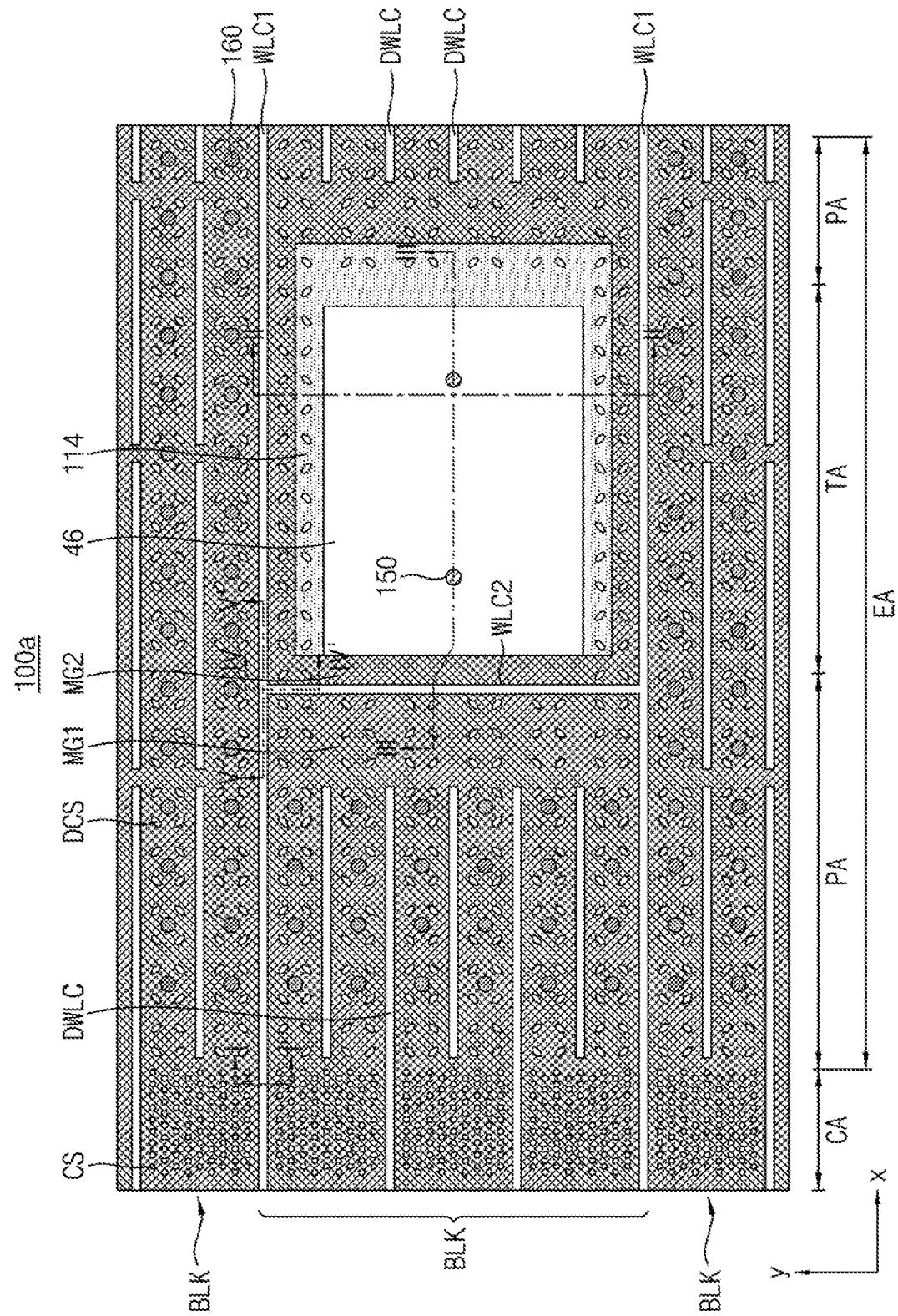
FIG. 1 is a layout of a semiconductor device according to an example embodiment.
Figure 2:
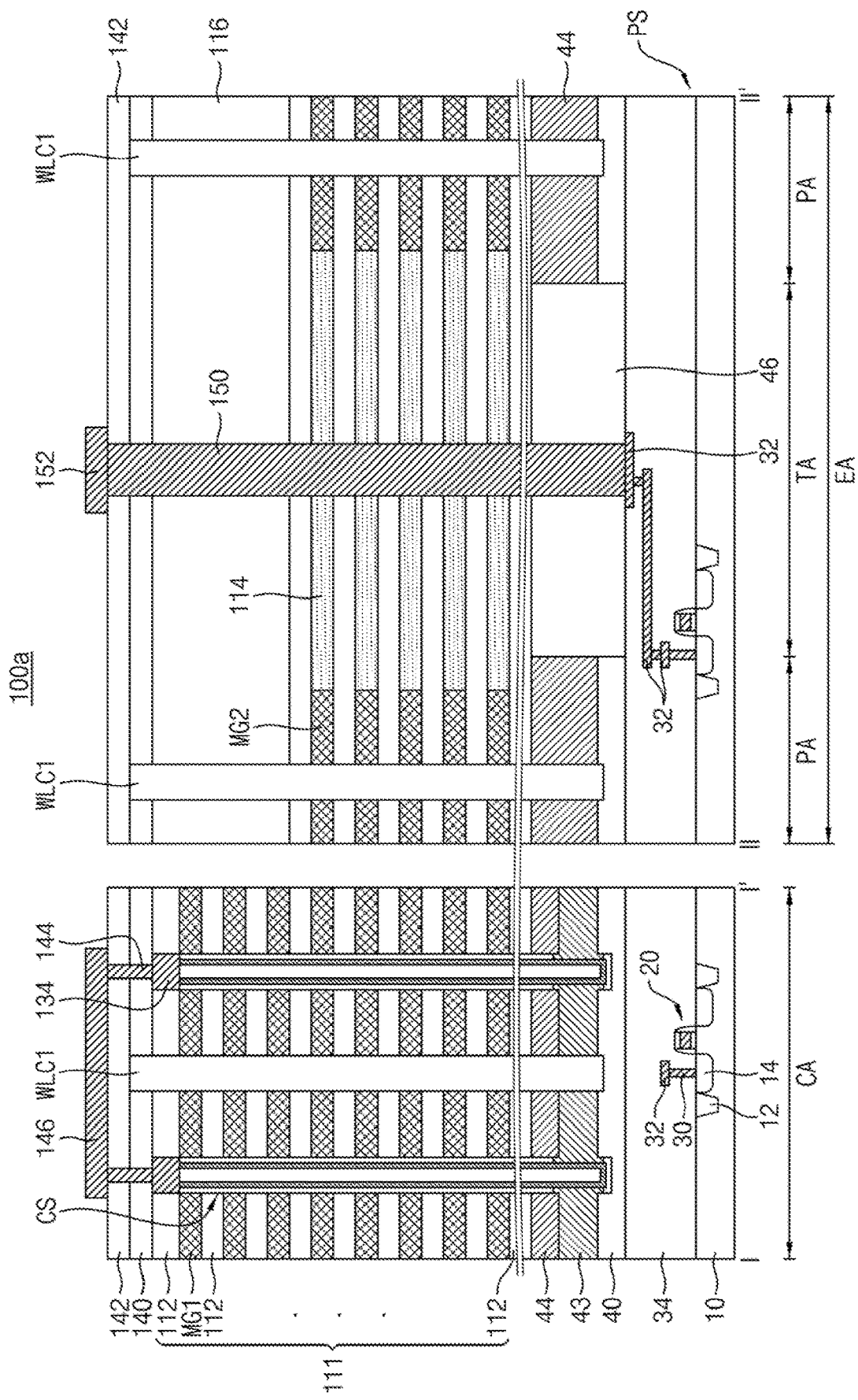
FIG. 2 illustrates vertical cross-sectional views of the semiconductor device shown in FIG. 1, taken along lines I-I' and II-II'.
Figure 3:
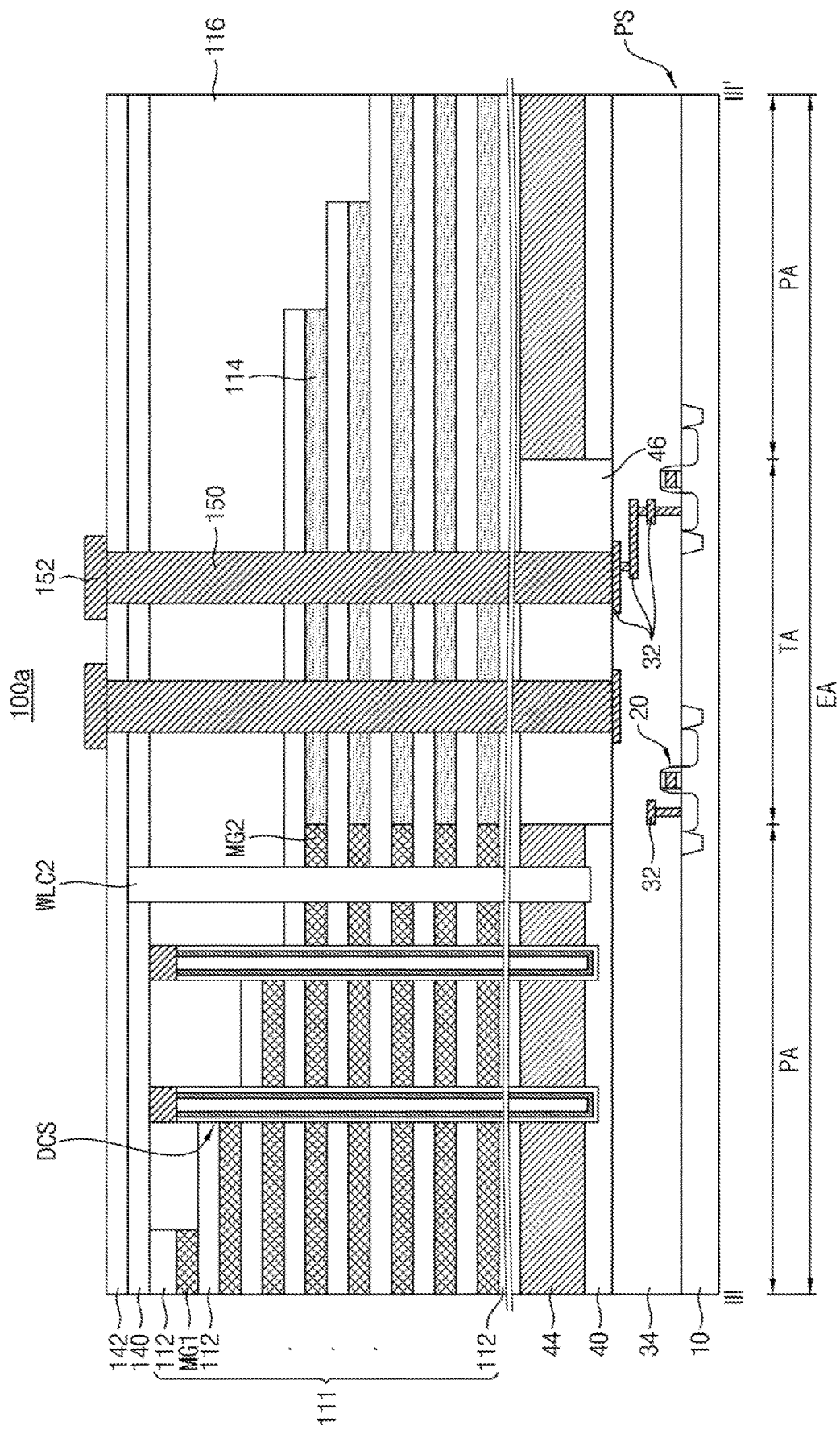
FIG. 3 is a vertical cross-sectional view of the semiconductor device shown in FIG. 1, taken along line III-III'.

FIG. 1 is a layout of a semiconductor device according to an example embodiment. FIG. 2 illustrates vertical cross-sectional views of the semiconductor device shown in FIG. 1, taken along lines I-I' and II-II'. FIG. 3 is a vertical cross-sectional view of the semiconductor device shown in FIG. 1, taken along line III-III'. A memory device according to example embodiments may include a flash memory such as 3D-NAND.

Referring to FIGS. 1, 2, and 3, a semiconductor device 100*a* may include a cell array area CA and an extension area EA. The extension area EA may include pad areas PA and a through electrode area TA between the pad areas PA.

The semiconductor device 100*a* may include channel structures CS in or on the cell array area CA, through electrodes 150 in or on the through electrode area TA, and dummy channel structures DCS and gate contacts 160 in or on the extension area EA.

The semiconductor device 100*a* may include the channel structures CS in the cell array area CA.

The semiconductor device 100*a* may further include first isolation insulating layers WLC1 extending (e.g., lengthwise) along a first horizontal direction x over the cell array area CA and the extension area EA. The first isolation insulating layers WLC1 may define memory blocks BLK. In an implementation, the first isolation insulating layers WLC1 may be between the memory blocks BLK. Dummy isolation insulating layers DWLC may be between the first isolation insulating layers WLC1 and may extend along the first horizontal direction x.

The semiconductor device 100*a* may include a peripheral circuit structure PS, a memory stack 111, a channel structure CS, a through electrode 150, and a gate contact 160. The semiconductor device 100*a* of the present disclosure may have a cell over peripheral (COP) structure. In an implementation, the peripheral circuit structure PS may be under the memory stack 111 (e.g., between the memory stack 111 and a substrate 10). The peripheral circuit structure PS may be on the substrate 10, and may include, e.g., a device isolation layer 12, an impurity region 14, a transistor 20, a contact plug 30, a peripheral circuit wire 32, and a peripheral insulating layer 34.

The device isolation layer 12 and the impurity region 14 may be on or in a top surface of the substrate 10. The transistor 20, the contact plug 30, and the peripheral circuit wire 32 may be on the substrate 10. The substrate 10 may include a semiconductor material. In an implementation, the substrate 10 may be, e.g., a silicon substrate, a germanium substrate, a silicon germanium substrate, or a silicon-on-insulator (SOI) substrate. In an implementation, the substrate 10 may include, e.g., a group IV semiconductor, a group III-V compound semiconductor, or a group II-VI oxide semiconductor. As used herein, the term "or" is not an exclusive term, e.g., "A or B" would include A, B, or A and B.

The impurity region 14 may be adjacent to the transistor 20. The peripheral insulating layer 34 may cover the transistor 20 and the contact plug 30. The contact plug 30 may be electrically connected to the impurity region 14. The peripheral circuit wire 32 may be connected to the contact plug 30.

The semiconductor device 100*a* may include a lower conductive layer 40, a connection mold layer 42, an connection conductive layer 43, a supporter 44, and a buried insulating layer 46, which are on the peripheral circuit structure PS. The lower conductive layer 40 may be on peripheral insulating layer 34. In an implementation, the lower conductive layer 40 may include doped polysilicon. The connection conductive layer 43 may be on the lower conductive layer 40 within the cell array area CA. The supporter 44 may cover the connection conductive layer 43, and may be in contact with the top surface of the lower conductive layer 40 within the extension area EA. The buried insulating layer 46 may be in the extension area EA. In an implementation, the buried insulating layer 46 may be within the through electrode area TA and may be in contact with the peripheral circuit structure PS through the lower conductive layer 40 and the supporter 44.

The memory stack 111 may be on the supporter 44. The memory stack 111 may include insulating layers 112, first gate electrodes MG1, second gate electrodes MG2, and mold layers 114. The insulating layers 112 may be between the first gate electrodes MG1 and may also be between the second gate electrodes MG2. In an implementation, the insulating layers 112 and the first gate electrodes MG1 may be sequentially stacked, e.g., stacked alternately with one another. The first gate electrodes MG1 and the second gate electrodes MG2 may be formed by replacing the mold layers 114. The mold layers 114 may be in the extension area EA. In an implementation, the mold layers 114 may be in the through electrode area TA, and may be positioned at the same level as (e.g., the same distance from the substrate 10 in a vertical direction as) the corresponding second gate electrode MG2. At least one of the first gate electrodes MG1 below the memory stack 111 may be a ground selection line (GSL). At least one of the first gate electrodes MG1 on the memory stack 111 may be a string selection line (SSL) or a drain selection line (DSL). In an implementation, the insulating layers 112 may include silicon oxide. The first gate electrodes MG1 and the second gate electrodes MG2 may include tungsten.

The semiconductor device 100*a* may include a second isolation insulating layer WLC2 in the extension area EA. In a plan view, the second isolation insulating layer WLC2 may cross the first isolation insulating layers WLC1 and may extend (e.g., lengthwise) in a second horizontal direction y. The second isolation insulating layer WLC2 may include the same material as the first isolation insulating layers WLC1. In an implementation, the second isolation insulating layer WLC2 may be materially continuous with the first isolation insulating layers WLC1 (e.g., may be continuously formed of the same material to form a monolithic, one-piece structure). The second isolation insulating layer WLC2 may not vertically overlap the dummy channel structures DCS. In an implementation, the second isolation insulating layer WLC2 may be between the dummy channel structures DCS. In a vertical cross-sectional view, the second isolation insulating layer WLC2 may be between the cell array area CA and the through electrode area TA and may vertically penetrate the memory stack 111. Portions of the second gate electrodes MG2 may be between the second isolation insulating layer WLC2 and the through electrode area TA. In an implementation, the second gate electrodes MG2 may fill between the mold layers 114 and the second isolation insulating layer WLC2. Interfaces between the second gate electrodes MG2 and the mold layers 114 may be positioned between the second isolation insulating layer WLC2 and the through electrode 150. The second isolation insulating layer WLC2 may be between the first gate electrodes MG1 and the second gate electrodes MG2. The second gate electrodes MG2 may be spatially and electrically separated from the first gate electrodes MG1 by the second isolation insulating layer WLC2. In an implementation, the second isolation insulating layer WLC2 may electrically insulate the first gate electrodes MG1 from the second gate electrodes MG2. An upper surface of the second isolation insulating layer WLC2 may be positioned at the same level as an upper surface of the first isolation insulating layer WLC1. In an implementation, a lower surface of the second isolation insulating layer WLC2 may be positioned at the same level as a lower surface of the first isolation insulating layer WLC1.

The memory stack 111 may have a staircase structure within the extension area EA. The interlayer insulating layer 116 may cover the staircase structure of the memory stack 111.

The channel structures CS may extend in the vertical direction through the connection conductive layer 43, the supporter 44, and the memory stack 111 within the cell array area CA. The channel structures CS may be electrically connected to the connection conductive layer 43.

Conductive pads 134 may be on the channel structures CS. The dummy channel structure DCS may be within the extension area EA. The dummy channel structure DCS may have a configuration that is the same as or similar to the configuration of the channel structure CS.

The semiconductor device 100a may include a first upper insulating layer 140 and a second upper insulating layer 142 on the memory stack 111 and the interlayer insulating layer 116. The second upper insulating layer 142 may be on the first upper insulating layer 140. The first isolation insulating layer WLC1 may vertically penetrate the first upper insulating layer 140, the memory stack 111, the supporter 44, and the connection conductive layer 43. A bit line plug 144 may penetrate the first upper insulating layer 140 and the second upper insulating layer 142, and may be connected to the conductive pad 134. A bit line 146 may be on the second upper insulating layer 142, and may be connected to the bit line plug 144.

The semiconductor device 100a may include the through electrode 150 within the through electrode area TA. The through electrode 150 may vertically penetrate the buried insulating layer 46, the memory stack 111, and the interlayer insulating layer 116. A connection wire 152 may be on the through electrode 150. The through electrode 150 may electrically connect the peripheral circuit wire 32 of the peripheral circuit structure PS to the connection wire 152.

The semiconductor device 100a may include gate contacts 160 within in the extension area EA. The gate contacts 160 may be between the dummy channel structures DCS and may include tungsten.

Figure 4:
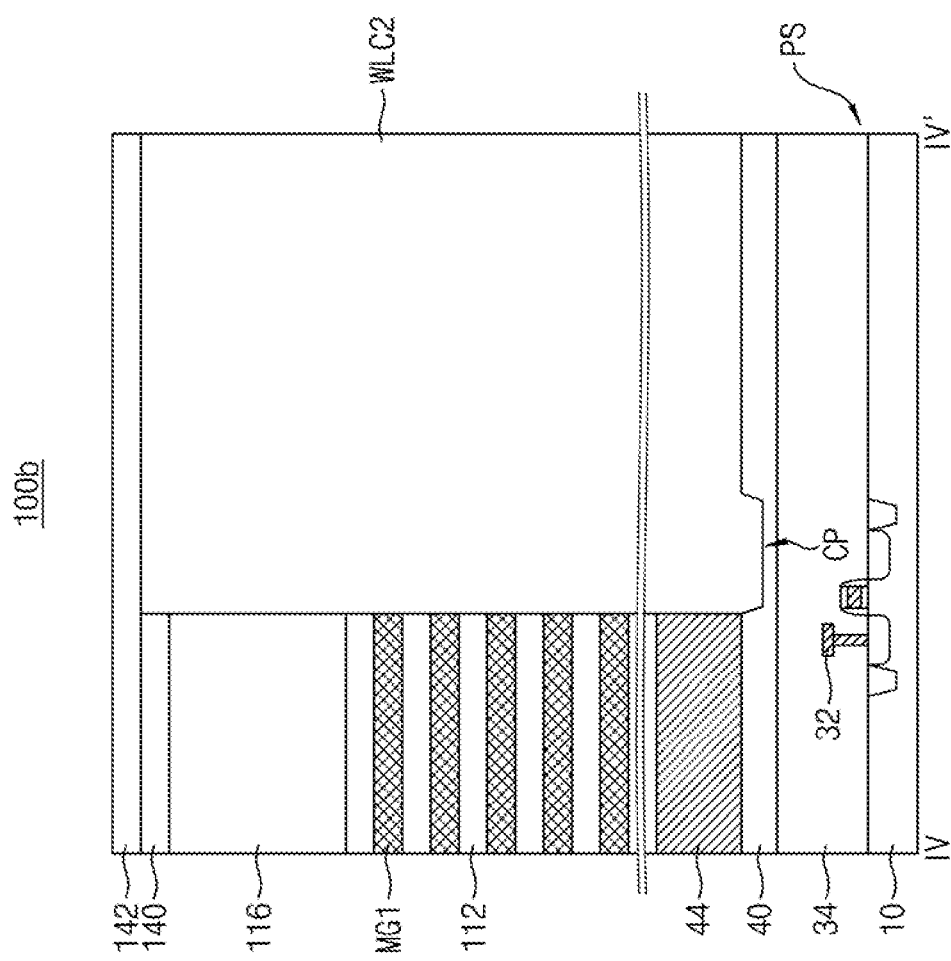
FIGS. 4 and 5 are vertical cross-sectional views of semiconductor devices taken along lines IV-IV' and V-V' according example embodiments.
Figure 5:
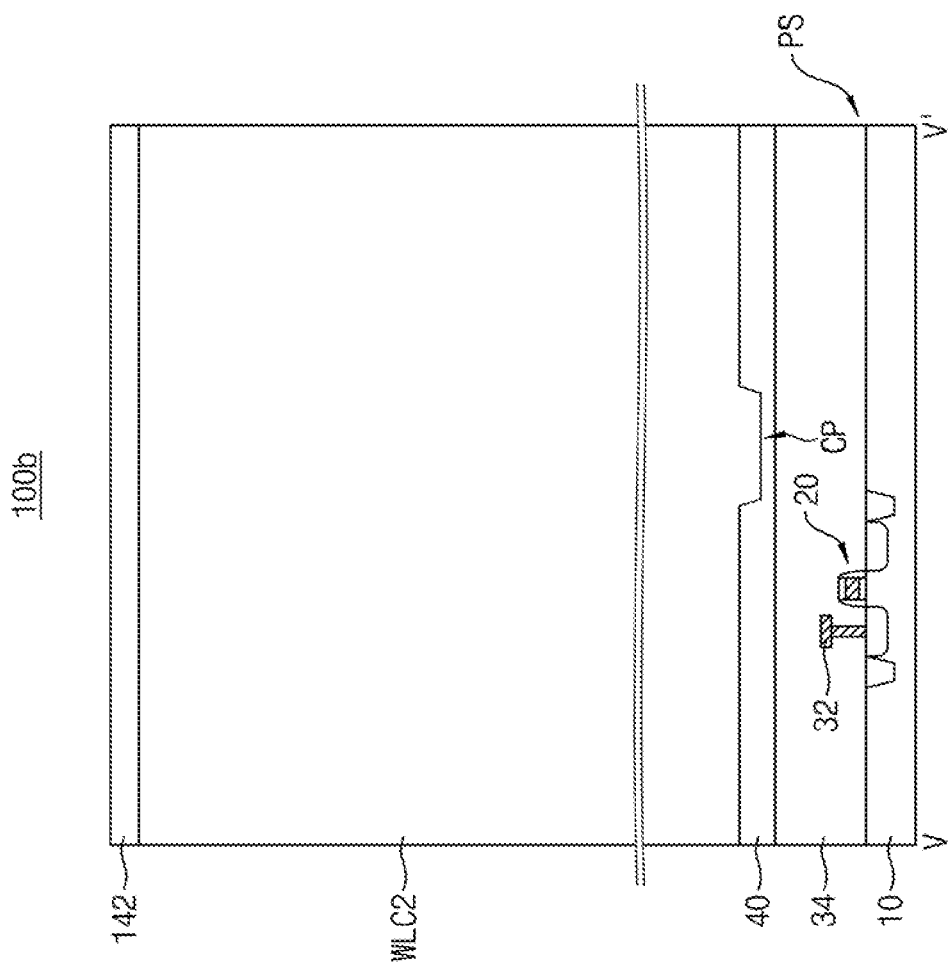

FIGS. 4 and 5 are vertical cross-sectional views of semiconductor devices taken along lines IV-IV' and V-V' according example embodiments.

Referring to FIGS. 4 and 5, a semiconductor device 100b may include a second isolation insulating layer WLC2 crossing a first isolation insulating layer WLC1. The first isolation insulating layer WLC1 and the second isolation insulating layer WLC2 may be formed by filling the inside of a trench formed by an anisotropic etching process. In the etching process, an intersection point or intersection region CP (e.g., where the first isolation insulating layer WLC1 and the second isolation insulating layer WLC2 meet) may be formed deeper than the first isolation insulating layer WLC1 and the second isolation insulating layer WLC2. In an implementation, a lower (e.g., substrate 10-facing) surface of the intersection region CP may be located at a lower level than (e.g., closer to the substrate 10 than) a lower surface of the first isolation insulating layer WLC1 and a lower surface of the second isolation insulating layer WLC2.

Figure 6:
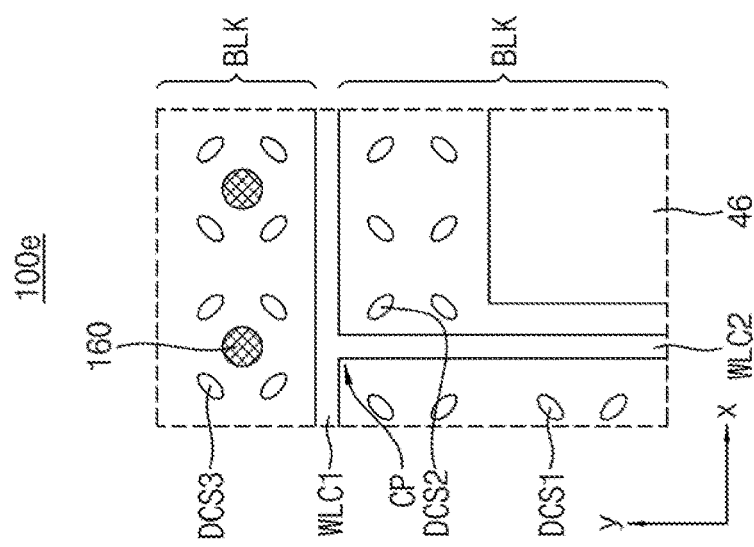
FIGS. 6 to 8 are enlarged views of semiconductor devices according to example embodiments.
Figure 7:
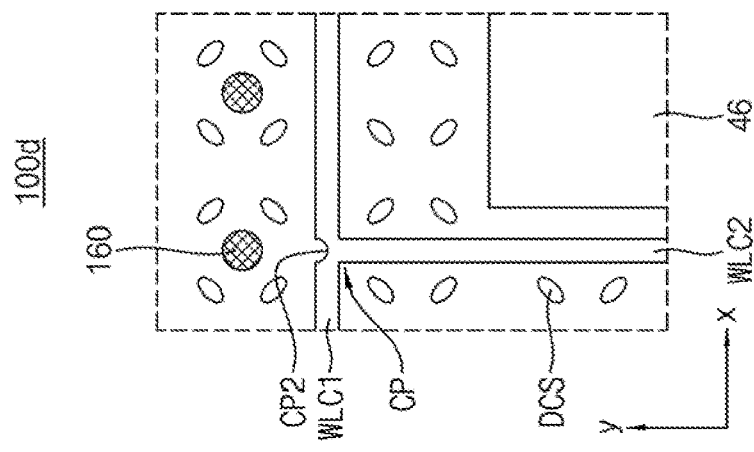
Figure 8:
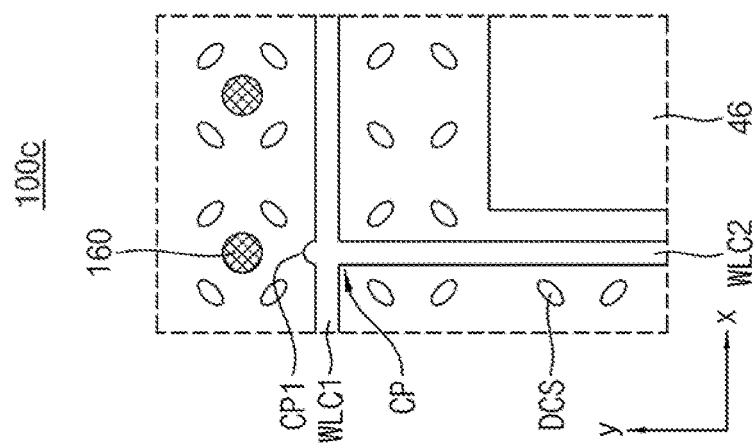

FIGS. 6 to 8 are enlarged views of semiconductor devices according to example embodiments.

Referring to FIG. 6, a semiconductor device 100c may include a second isolation insulating layer WLC2 crossing a first isolation insulating layer WLC1. In an implementation, an intersection region CP between the first isolation insulating layer WLC1 and the second isolation insulating layer WLC2 may include a protrusion CP1. In an implementation, the protrusion CP1 may be formed to be convex and protrude outwardly in the second horizontal direction y at the intersection region CP.

Referring to FIG. 7, a semiconductor device 100d may include a second isolation insulating layer WLC2 crossing a first isolation insulating layer WLC1. In an implementation, an intersection region CP between the first isolation insulating layer WLC1 and the second isolation insulating layer WLC2 may include a depression CP2. In an implementation, the depression CP2 may be formed to be concave and protrude inwardly in the second horizontal direction y at the intersection point CP.

Referring to FIG. 8, a semiconductor device 100e may include a first dummy channel structure DCS1, a second dummy channel structure DCS2, and a third dummy channel structure DCS3. The first dummy channel structure DCS1 and the second dummy channel structure DCS2 may be spaced apart in the first horizontal direction x with the second isolation insulating layer WLC2 therebetween. The first dummy channel structure DCS1 and the third dummy channel structure DCS3 may be spaced apart in the second horizontal direction y with the first isolation insulating layer WLC1 therebetween. The first dummy channel structure DCS1 may be in the same memory block BLK as the second dummy channel structure DCS2, and the third dummy channel structure DCS3 may be in a memory block BLK different from the first dummy channel structure DCS1.

The first dummy channel structure DCS1, the second dummy channel structure DCS2, and the third dummy channel structure DCS3 may be formed before the first isolation insulating layer WLC1 and the second isolation insulating layer WLC2 are formed, and may be arranged in a regular pattern. In an implementation, the first dummy channel structure DCS1 may be arranged to be aligned with the second dummy channel structure DCS2 in the first horizontal direction x, and may arranged to be aligned with the third dummy channel structure DCS3 in the second horizontal direction y. Referring further to FIG. 3, a portion of the memory stack 111 in the pad area PA that is close to the cell array area CA may be heavier than a portion of the memory stack 111 in the through electrode area TA. In an implementation, in the pad area PA close or adjacent to the cell array area CA, the memory stack 111 may include first gate electrodes MG1, and in the through electrode area TA, the memory stack 111 may include second gate electrodes MG2 and mold layers 114. Accordingly, after the first gate electrodes MG1 and the second gate electrodes MG2 are formed, the dummy channel structure DCS may move toward the opposite side of the second isolation insulating layer WLC2. In an implementation, e.g., as illustrated in FIG. 8, the first dummy channel structure DCS1 may not be aligned with the third dummy channel structure DCS3 in the second horizontal direction y. A horizontal distance between the second isolation insulating layer WLC2 and the first dummy channel structure DCS1 may be greater than a horizontal distance between the second isolation insulating layer WLC2 and the second dummy channel structure DCS2.

Figure 9:
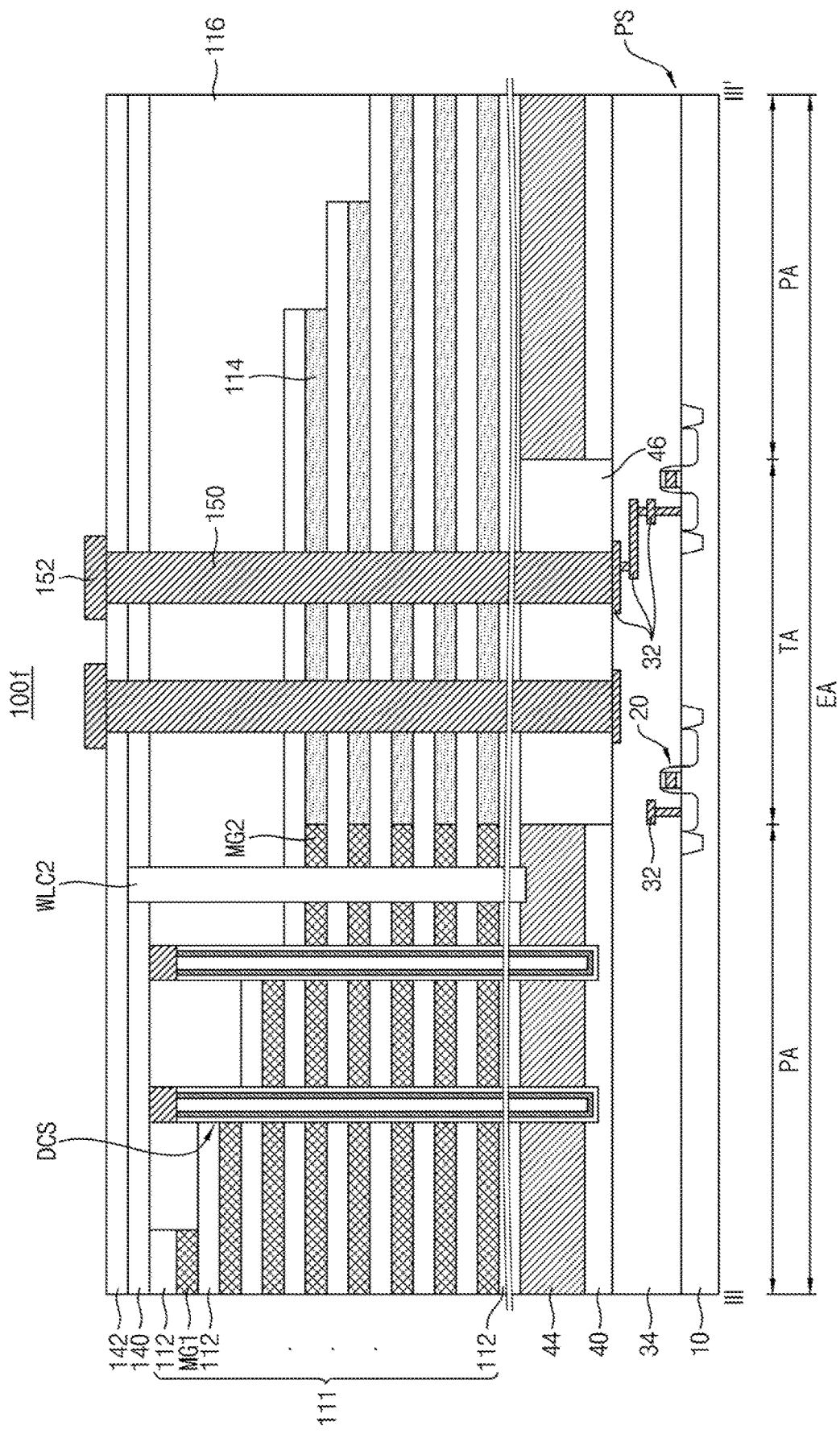
FIG. 9 is a vertical cross-sectional view of a semiconductor device taken along line according to an example embodiment.

FIG. 9 is a vertical cross-sectional view of a semiconductor device taken along line according to an example embodiment.

Referring to FIG. 9, a semiconductor device 100f may include a second isolation insulating layer WLC2 penetrating the memory stack 111. In an implementation, a depth (e.g., a vertical height) of the second isolation insulating layer WLC2 may be less than the depth of the first isolation insulating layer WLC1. Referring to FIG. 2, the first isolation insulating layer WLC1 may completely penetrate the connection conductive layer 43, the supporter 44, and the memory stack 111. The second isolation insulating layer WLC2 may penetrate the memory stack 111 and may not completely penetrate the supporter 44. In an implementation, the lower (e.g., substrate 10-facing) surface of the second isolation insulating layer WLC2 may be positioned at a higher level than (e.g., may be farther from the substrate 10 in a vertical direction than) the lower surface of the first isolation insulating layer WLC1.

Figure 10:
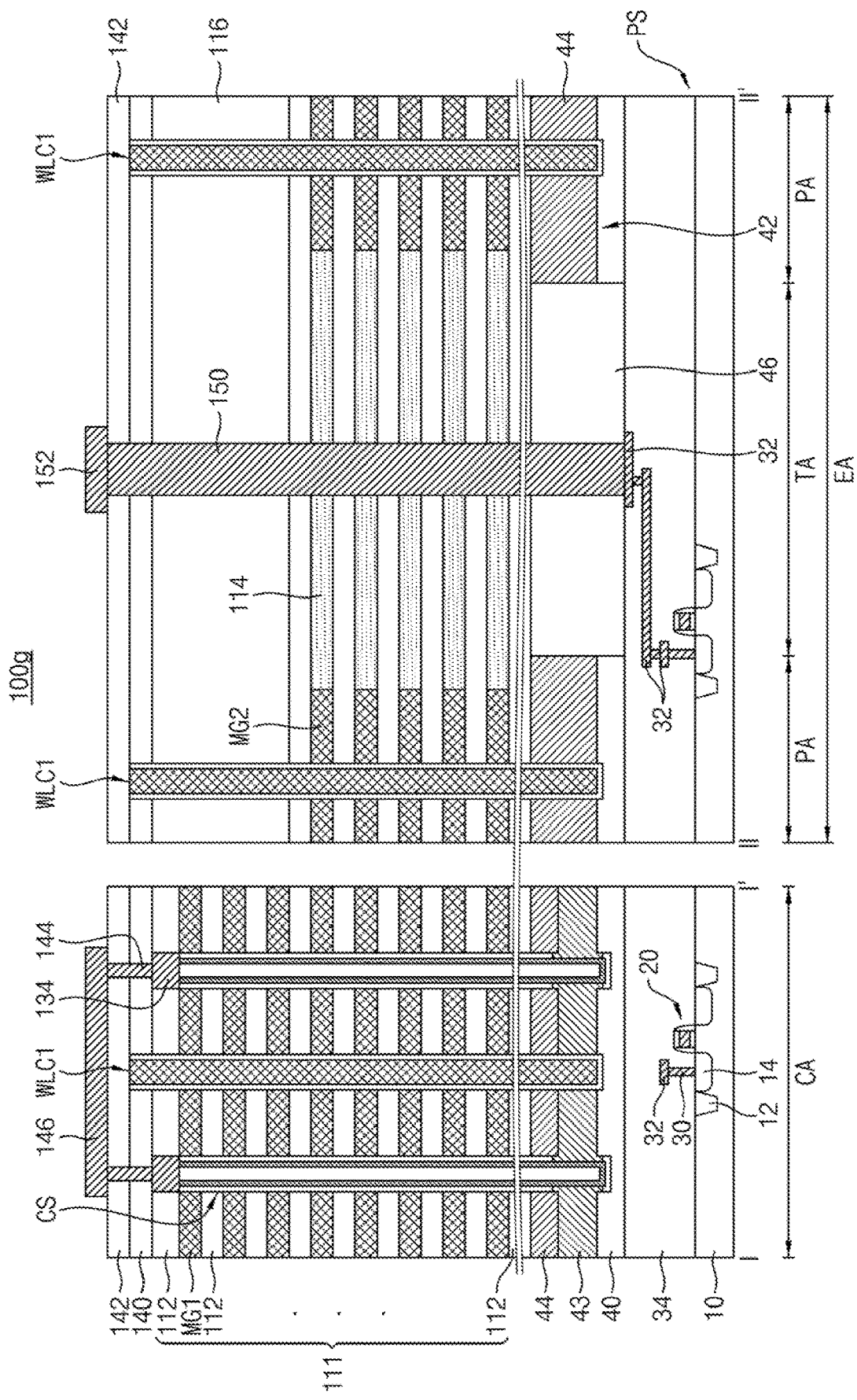
FIGS. 10 and 11 are vertical cross-sectional views of semiconductor devices taken along lines I-I', II-II' and III-III' according example embodiments.
Figure 11:
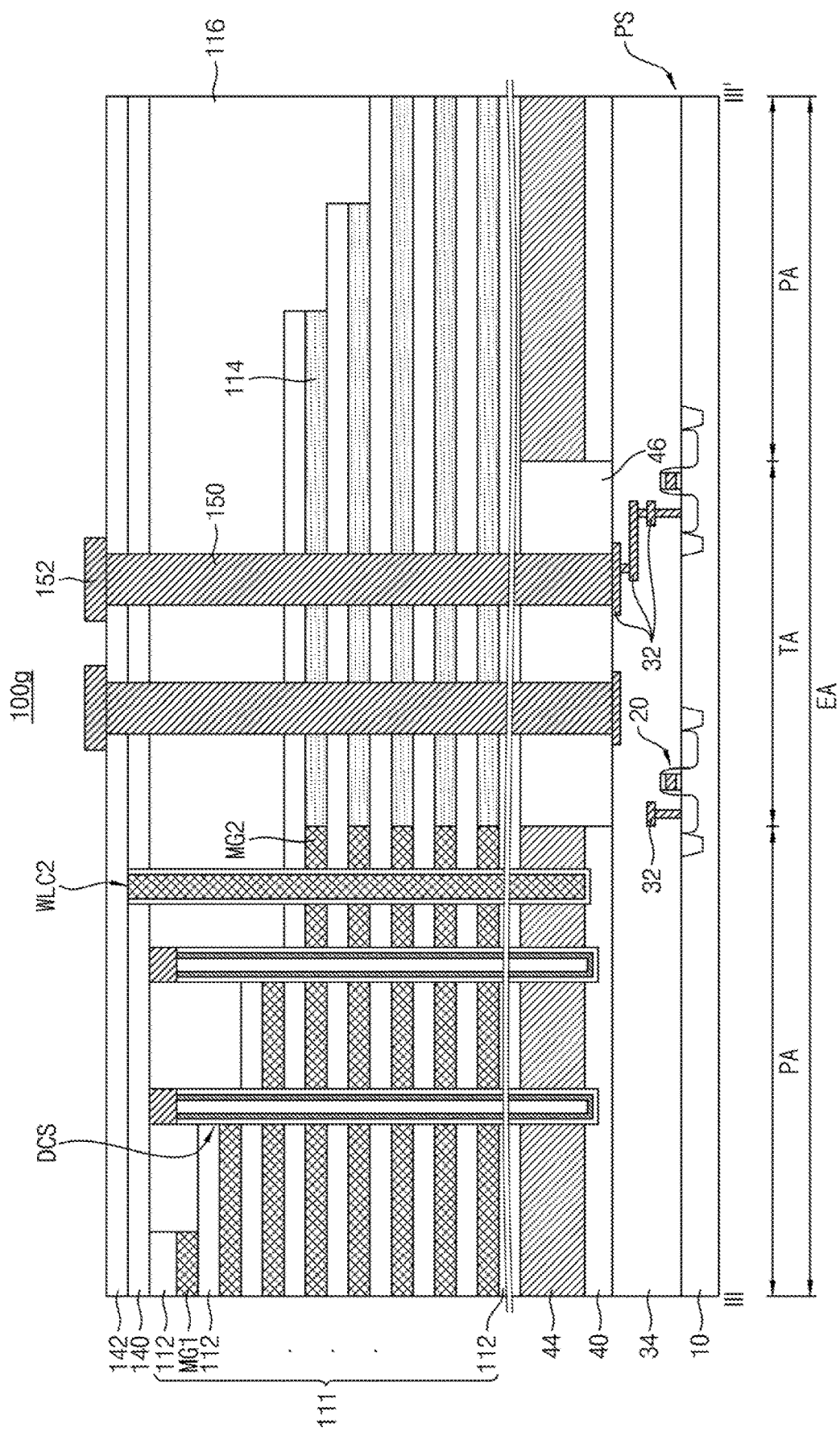

FIGS. 10 and 11 are vertical cross-sectional views of semiconductor devices taken along lines I-I', II-II' and III-III' according example embodiments.

Referring to FIGS. 10 and 11, a semiconductor device 100g may include a first isolation insulating layer WLC1 and a second isolation insulating layer WLC2 penetrating through the memory stack 111. The second isolation insulating layer WLC2 may include the same material as the first isolation insulating layer WLC1. In an implementation, the first isolation insulating layer WLC1 and the second isolation insulating layer WLC2 may include a filling material and an insulating layer surrounding the filling material. The filling material may include a metal, a metal nitride, a metal silicide, a metal oxide, a conductive carbon, polysilicon, or a combination thereof. The insulating layer may include, e.g., silicon oxide, silicon nitride, silicon oxynitride, a low-k dielectric material, a high-k dielectric material, or a combination thereof. In an implementation, the filling material may include tungsten, and the insulating layer may include silicon oxide.

Figure 12:
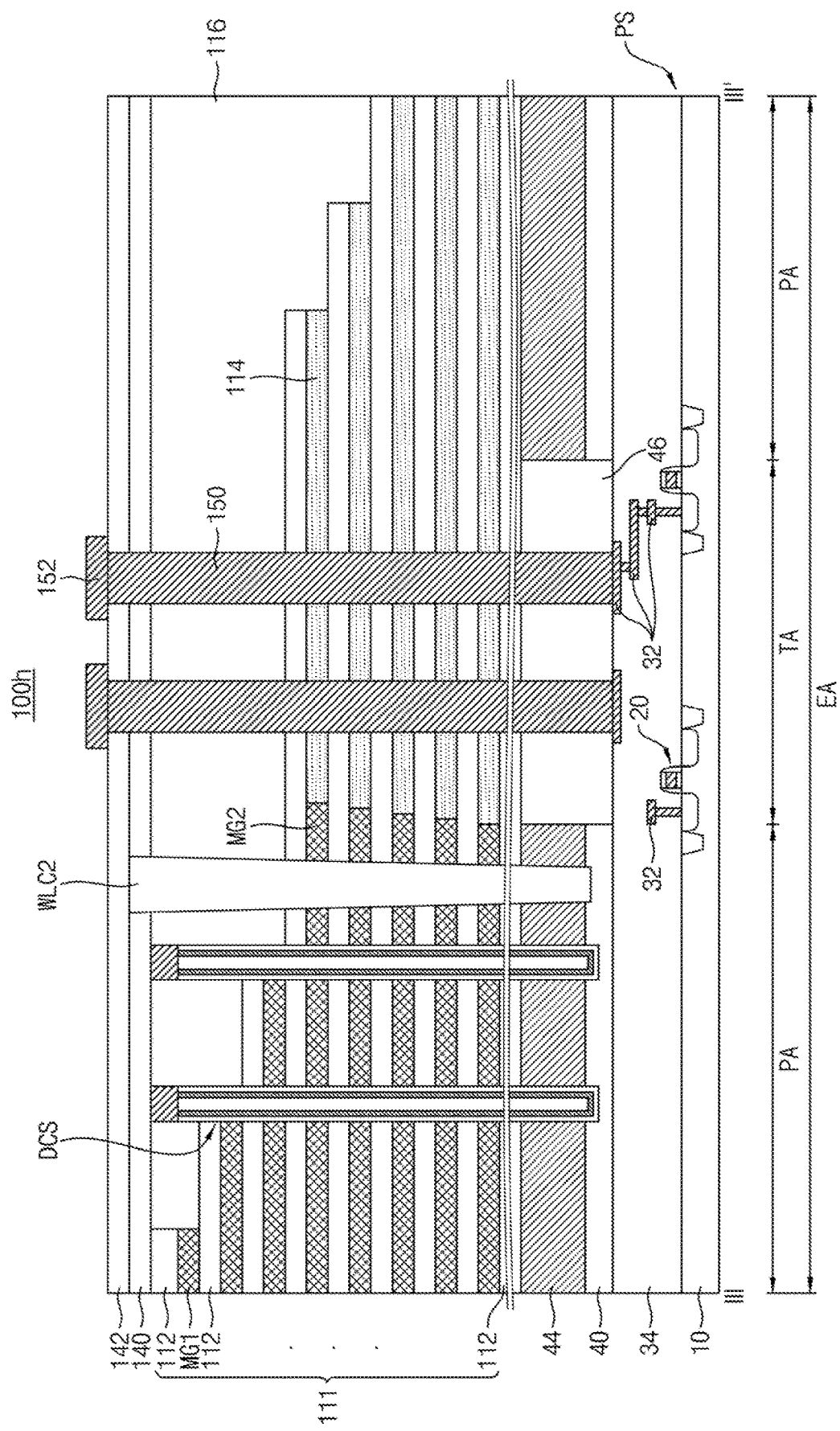
FIGS. 12 to 14 are vertical cross-sectional views of semiconductor devices taken along line according to example embodiments.
Figure 13:
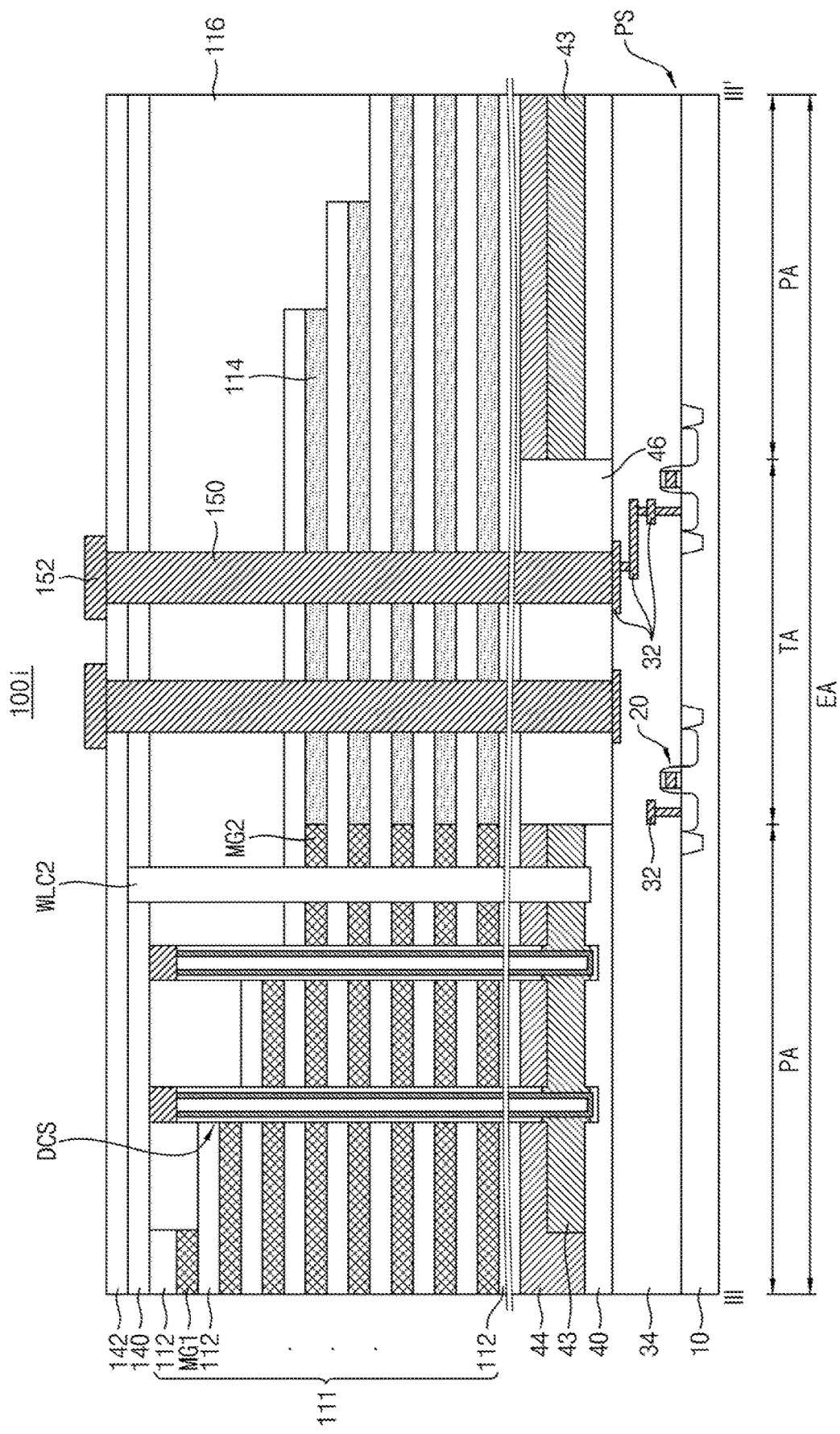
Figure 14:
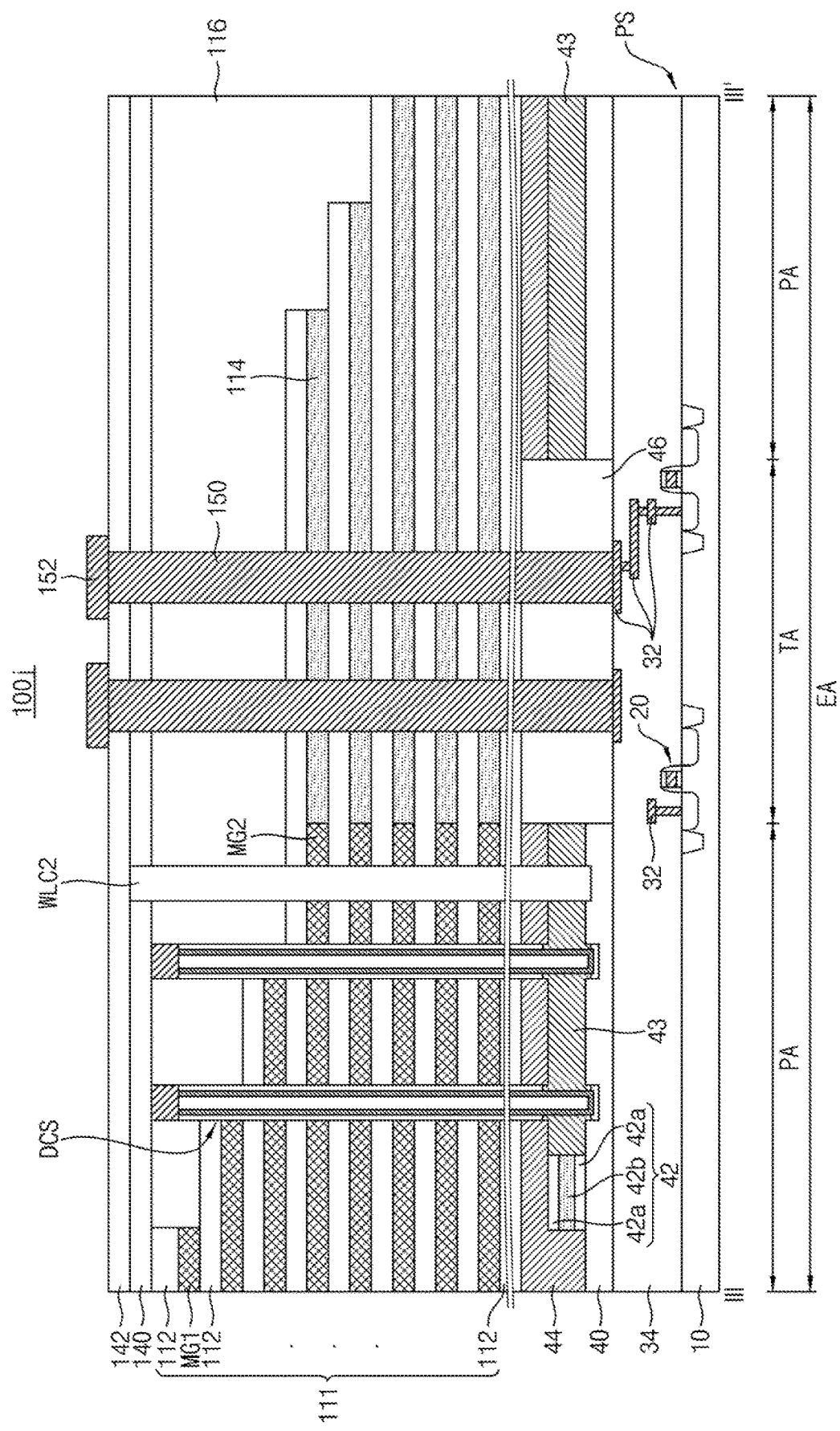

FIGS. 12 to 14 are vertical cross-sectional views of semiconductor devices taken along line according to example embodiments.

Referring to FIG. 12, a semiconductor device 100h may include a second isolation insulating layer WLC2 vertically penetrating the memory stack 111. In an implementation, the second isolation insulating layer WLC2 may have a tapered shape. In an implementation, a horizontal width of the second isolation insulating layer WLC2 may decrease from top (e.g., distal to the substrate 10) to bottom (e.g., proximate to the substrate 10). The sizes of the second gate electrodes MG2 between the mold layers 114 and the second isolation insulating layer WLC2 may be different from each other. In an implementation, a relatively upper portion or selection of the second gate electrodes MG2 (e.g., distal to the substrate 10) may have a greater horizontal width than a relatively lower portion or selection of the second gate electrodes MG2 (e.g., proximate to the substrate 10).

Referring to FIG. 13, a semiconductor device 100i may include a connection conductive layer 43, a supporter 44, and a second isolation insulating layer WLC2 vertically penetrating the memory stack 111. In an implementation, the connection conductive layer 43 may be between the lower conductive layer 40 and the supporter 44 in the extension area EA. The connection conductive layer 43 may be connected to the dummy channel structure DCS. The connection conductive layer 43 may not be connected to the connection conductive layer 43 in the cell array area CA shown in FIG. 2.

Referring to FIG. 14, a semiconductor device 100j may include a connection mold layer 42 positioned at the same level as the connection conductive layer 43. The connection mold layer 42 may include a protective layer 42a and an insulating layer 42b on upper and lower surfaces of the protective layer 42a. The connection conductive layer 43 may be formed by replacing the connection mold layer 42 with a conductive material. In an implementation, the connection mold layer 42 may not be completely replaced in the extension area EA. Accordingly, the connection mold layer 42 may be at the same level as the connection conductive layer 43 in the extension area EA. In an implementation, as shown in FIG. 14, the dummy channel structure DCS may contact the connection conductive layer 43. In an implementation, the dummy channel structure DCS may contact the connection mold layer 42.

Figure 15:
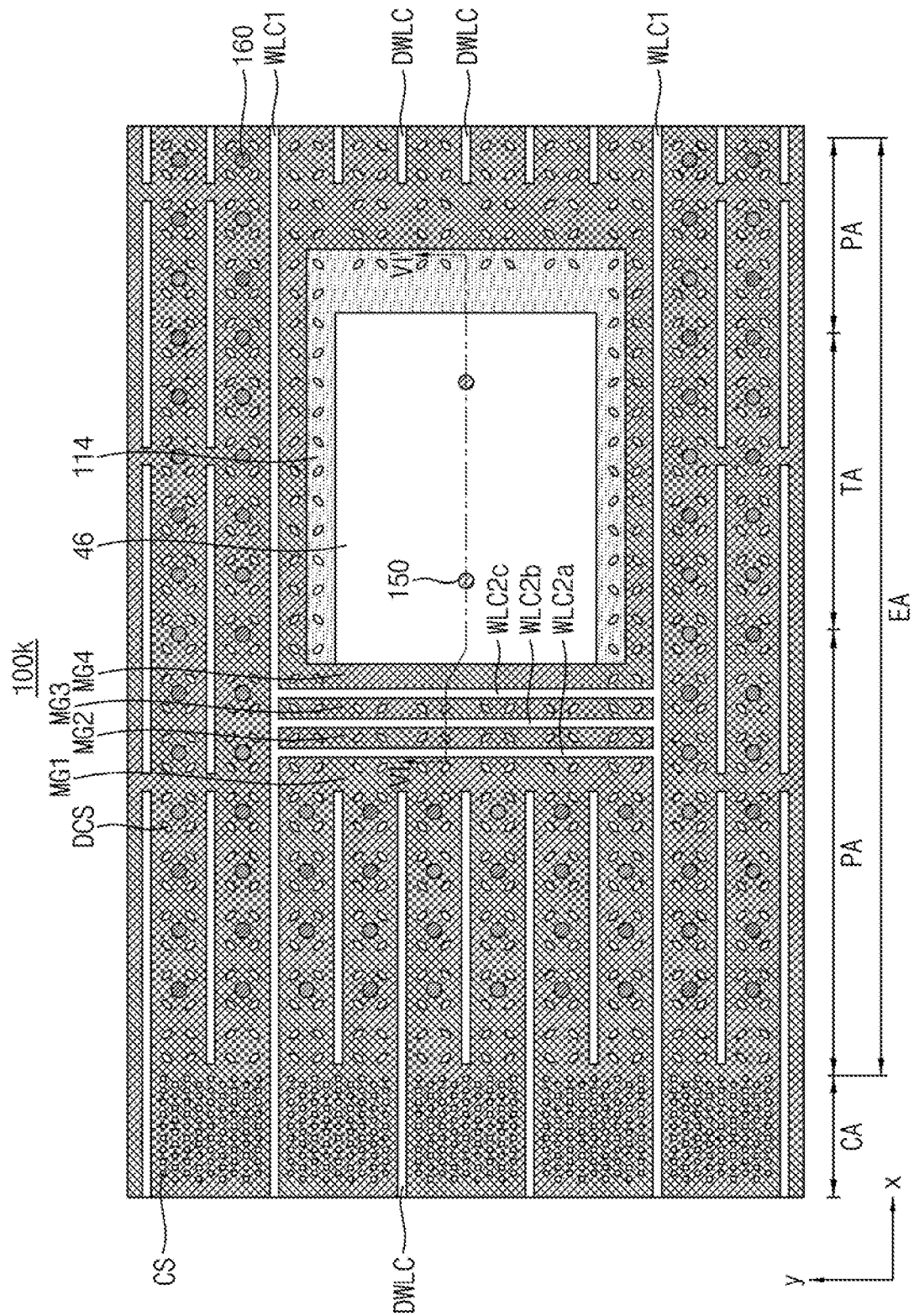
FIG. 15 is a layout of a semiconductor device according to an example embodiment.
Figure 16:
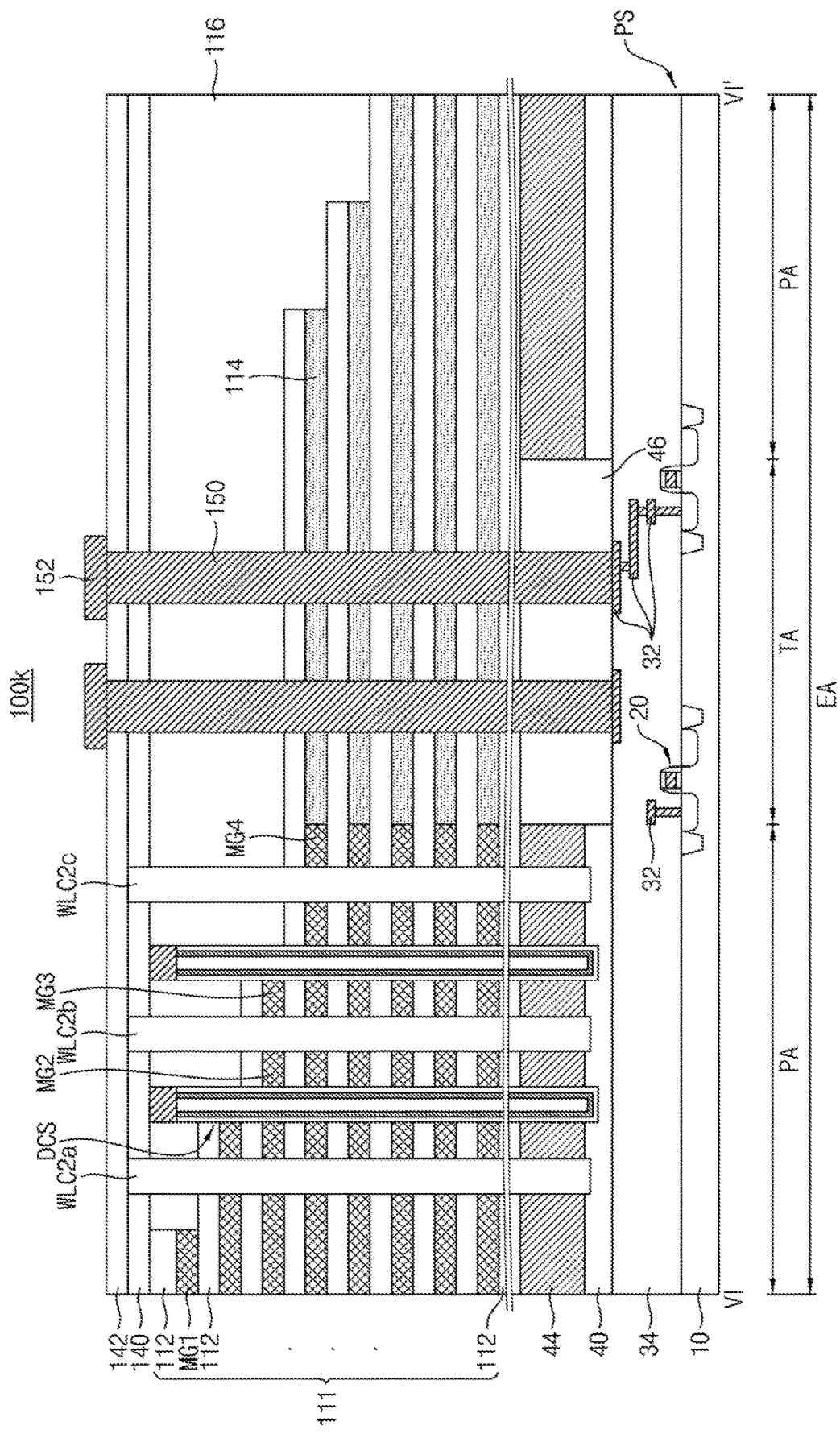
FIG. 16 is a vertical cross-sectional view of the semiconductor device shown in FIG. 15, taken along lines VI-VI'.

FIG. 15 is a layout of a semiconductor device according to an example embodiment. FIG. 16 is a vertical cross-sectional view of the semiconductor device shown in FIG. 15, taken along lines VI-VI'.

Referring to FIGS. 15 and 16, a semiconductor device 100k may include a left second isolation insulating layer WLC2a, an intermediate second isolation insulating layer WLC2b, and a right second isolation insulating layer WLC2c crossing the first isolation insulating layers WLC1. In a plan view, the left second isolation insulating layer WLC2a, the intermediate second isolation insulating layer WLC2b, and the right second isolation insulating layer WLC2c may extend (e.g., lengthwise) in a second horizontal direction y, and may be spaced apart from each other along the first horizontal direction x. The left second isolation insulating layer WLC2a may be closest or proximate to the cell array area CA, and the intermediate second isolation insulating layer WLC2b may be between the left second isolation insulating layer WLC2a and the right second isolation insulating layer WLC2c. In the vertical sectional view, the left second isolation insulating layer WLC2a, the intermediate second isolation insulating layer WLC2b, and the right second isolation insulating layer WLC2c may vertically penetrate the supporter 44 and the memory stack 111. The dummy channel structures DCS may be between the left second isolation insulating layer WLC2a, the intermediate second isolation insulating layer WLC2b, and the right second isolation insulating layer WLC2c.

The memory stack 111 may include first gate electrodes MG1, second gate electrodes MG2, third gate electrodes MG3, and fourth gate electrodes MG4. The first gate electrodes MG1 may extend from the cell array area CA. The second gate electrodes MG2 may be between the left second isolation insulating layer WLC2a and the intermediate second isolation insulating layer WLC2b. The third gate electrodes MG3 may be between the intermediate second isolation insulating layer WLC2b and the right second isolation insulating layer WLC2c. The fourth gate electrodes MG4 may be between the right second isolation insulating layer WLC2c and the through electrode area TA. The left second isolation insulating layer WLC2a may electrically and spatially separate the first gate electrodes MG1 from the second gate electrodes MG2. The intermediate second isolation insulating layer WLC2b may electrically and spatially separate the second gate electrodes MG2 from the third gate electrodes MG3. The right second isolation insulating layer WLC2c may electrically and spatially separate the third gate electrodes MG3 from the fourth gate electrodes MG4. In an implementation, as illustrated in FIG. 15, three second isolation insulating layers WLC2a, WLC2b, and WLC2c may be present. In an implementation, two second isolation insulating layers or more than three second isolation insulating layers may be present.

Figure 17:
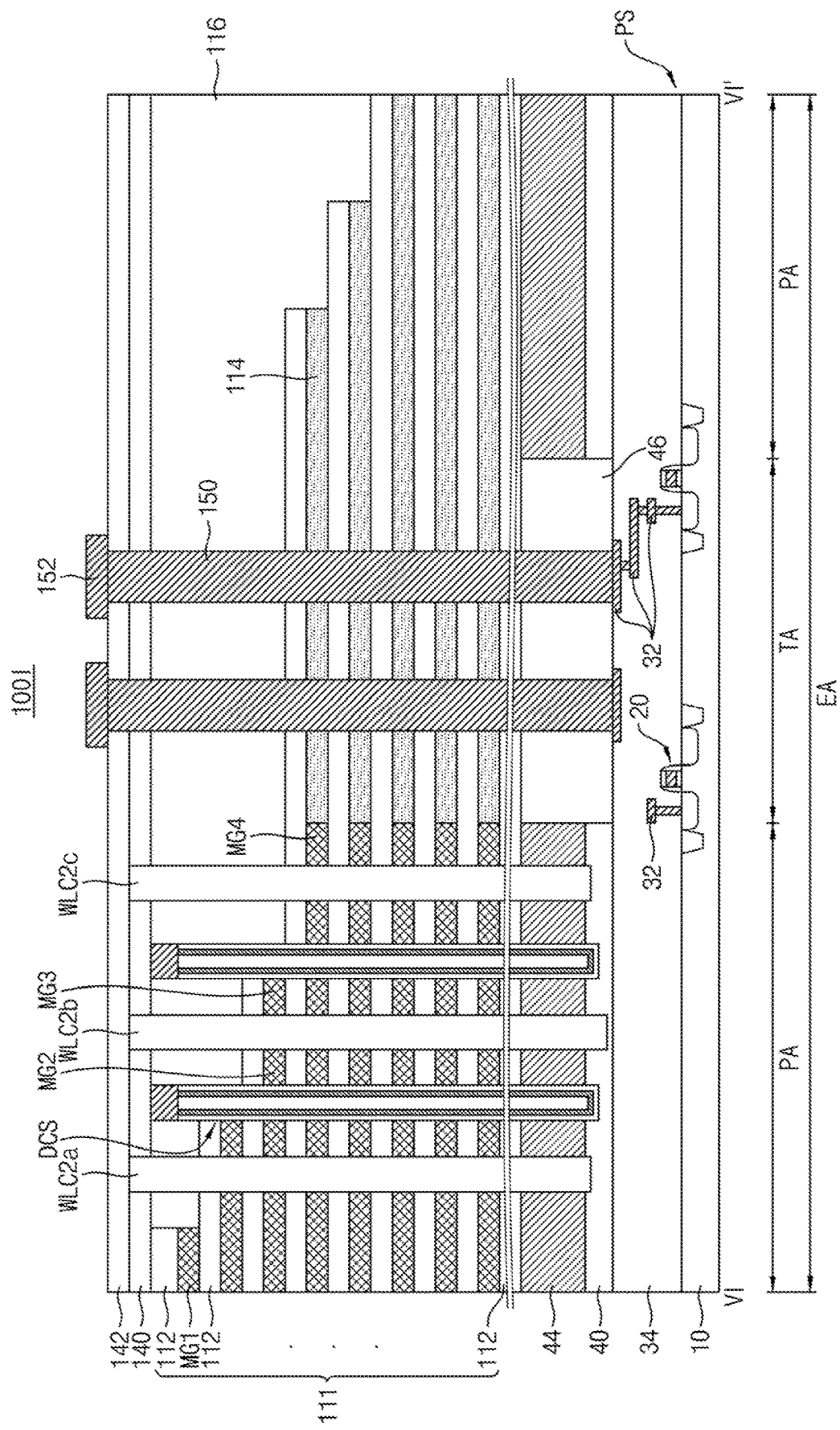
FIGS. 17 and 18 are vertical cross-sectional views of semiconductor devices taken along line VI-VI' according to example embodiments.
Figure 18:
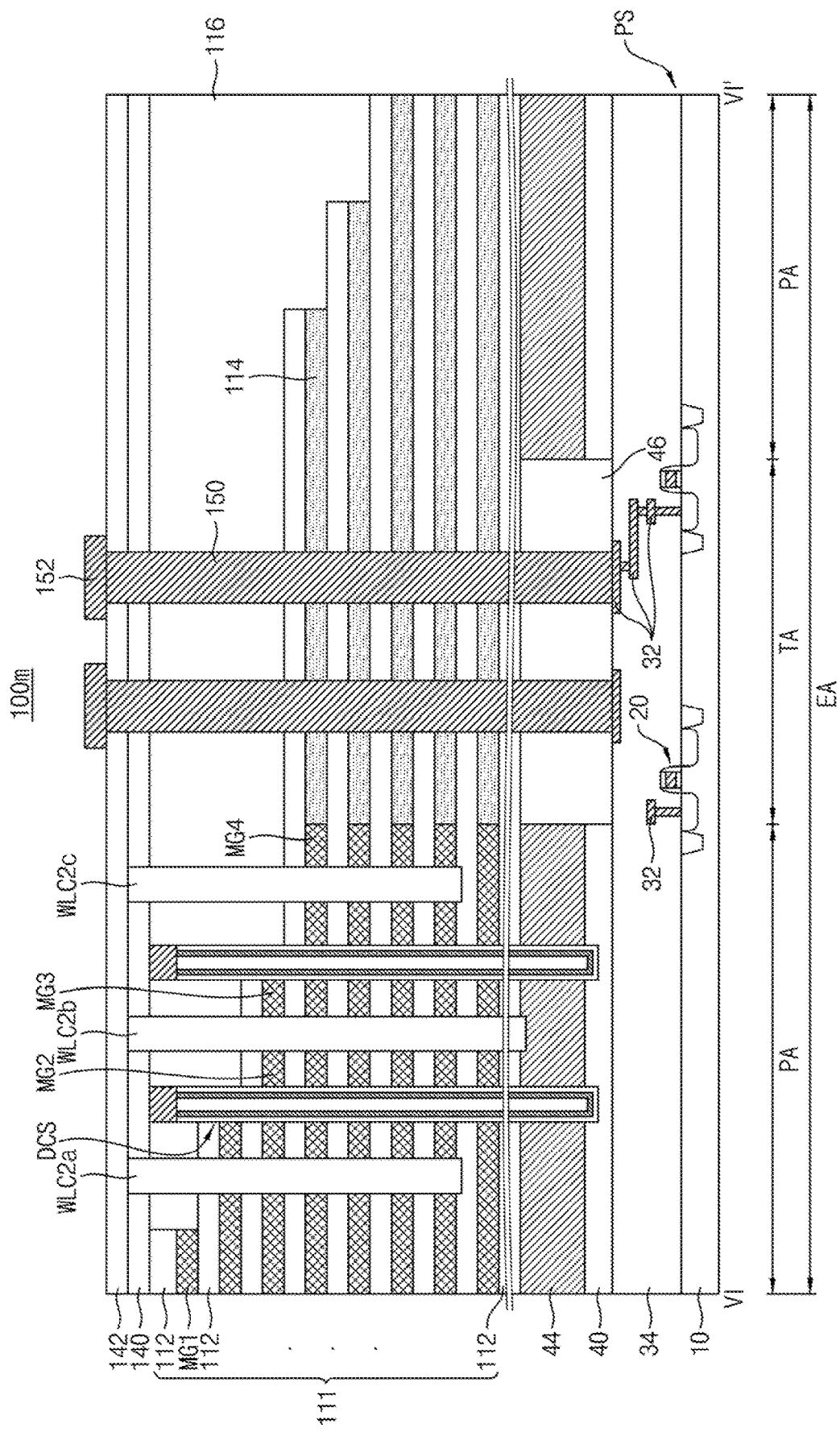

FIGS. 17 and 18 are vertical cross-sectional views of semiconductor devices taken along line VI-VI' according to example embodiments.

Referring to FIG. 17, a semiconductor device 100l may include a left second isolation insulating layer WLC2a, an intermediate second isolation insulating layer WLC2b, and a right second isolation insulating layer WLC2c crossing the first isolation insulating layers WLC1. In an implementation, depths (e.g., vertical heights) of the second isolation insulating layers WLC2a, WLC2b, and WLC2c may be different from each other. In an implementation, the depth of the intermediate second isolation insulating layer WLC2b may be greater than the depths of the left second isolation insulating layer WLC2a and the right second isolation insulating layer WLC2c, and a lower (e.g., substrate 10-facing) surface of the intermediate second isolation insulating layer WLC2b may be positioned at a lower level than (e.g., closer to the substrate 10 than) lower surfaces of the left second isolation insulating layer WLC2a and the right second isolation insulating layer WLC2c.

Referring to FIG. 18, a semiconductor device 100m may include a left second isolation insulating layer WLC2a, an intermediate second isolation insulating layer WLC2b, and a right second isolation insulating layer WLC2c crossing the first isolation insulating layers WLC1. The intermediate second isolation insulating layer WLC2b may be formed deeper (e.g., may have a greater vertical height) than the left second isolation insulating layer WLC2a and the right second isolation insulating layer WLC2c. In an implementation, the intermediate second isolation insulating layer WLC2b may completely penetrate the memory the stack 111, and the left second isolation insulating layer WLC2a and the right second isolation insulating layer WLC2c may not completely penetrate the memory stack 111. Some of the second gate electrodes MG2 may be connected to the first gate electrodes MG1, and some of the fourth gate electrodes MG4 may be connected to the third gate electrodes MG3. In an implementation, the intermediate second isolation insulating layer WLC2b may electrically and spatially separate the second gate electrodes MG2 from the third gate electrodes MG3. Accordingly, even if word line bridging were to occur around the through electrode area TA, the operation of the memory cell by the first gate electrode MG1 may not be adversely affected.

Figure 19:
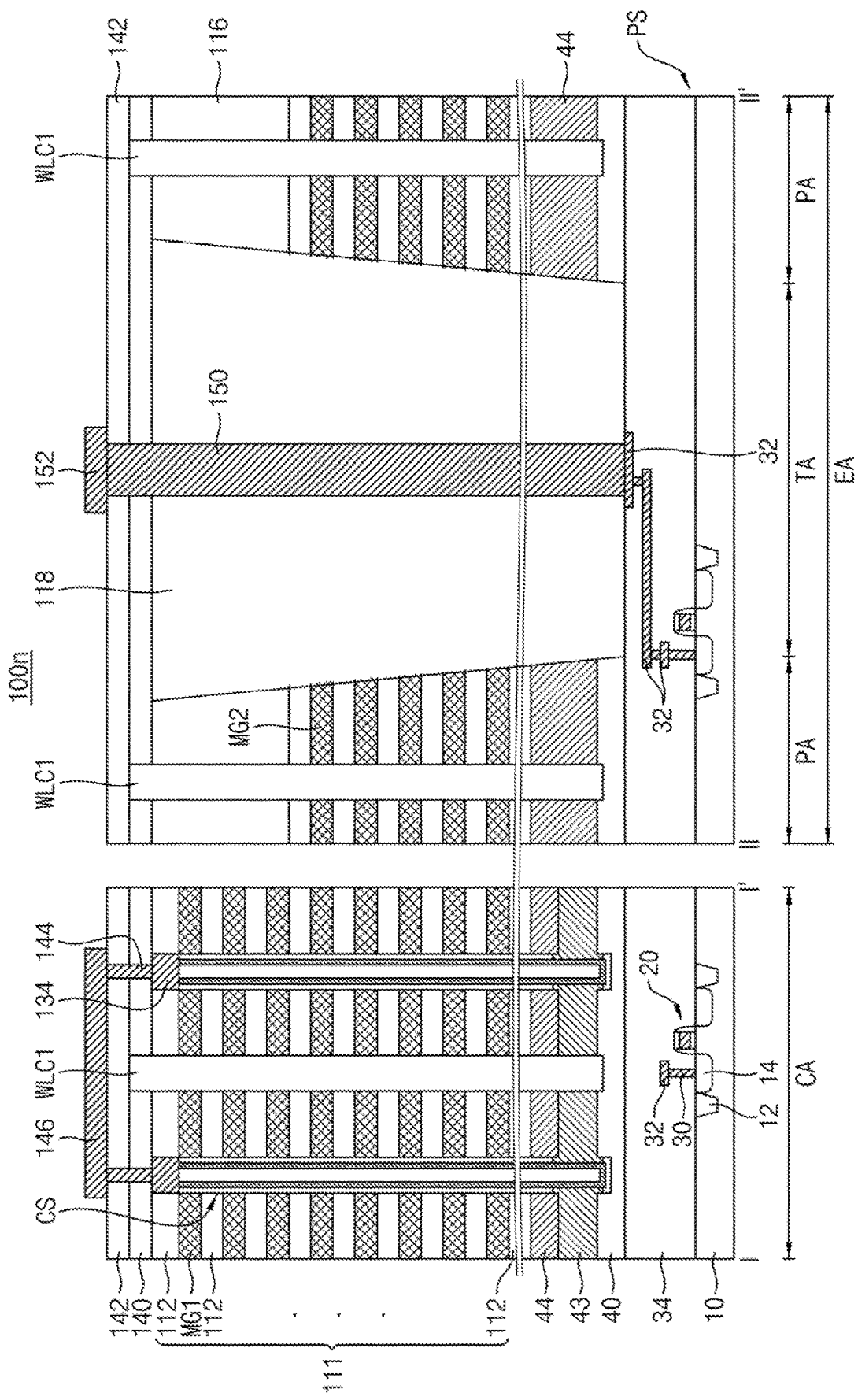
FIGS. 19 and 20 are vertical cross-sectional views of semiconductor devices taken along lines I-I', II-II' and III-III' according example embodiments.
Figure 20:
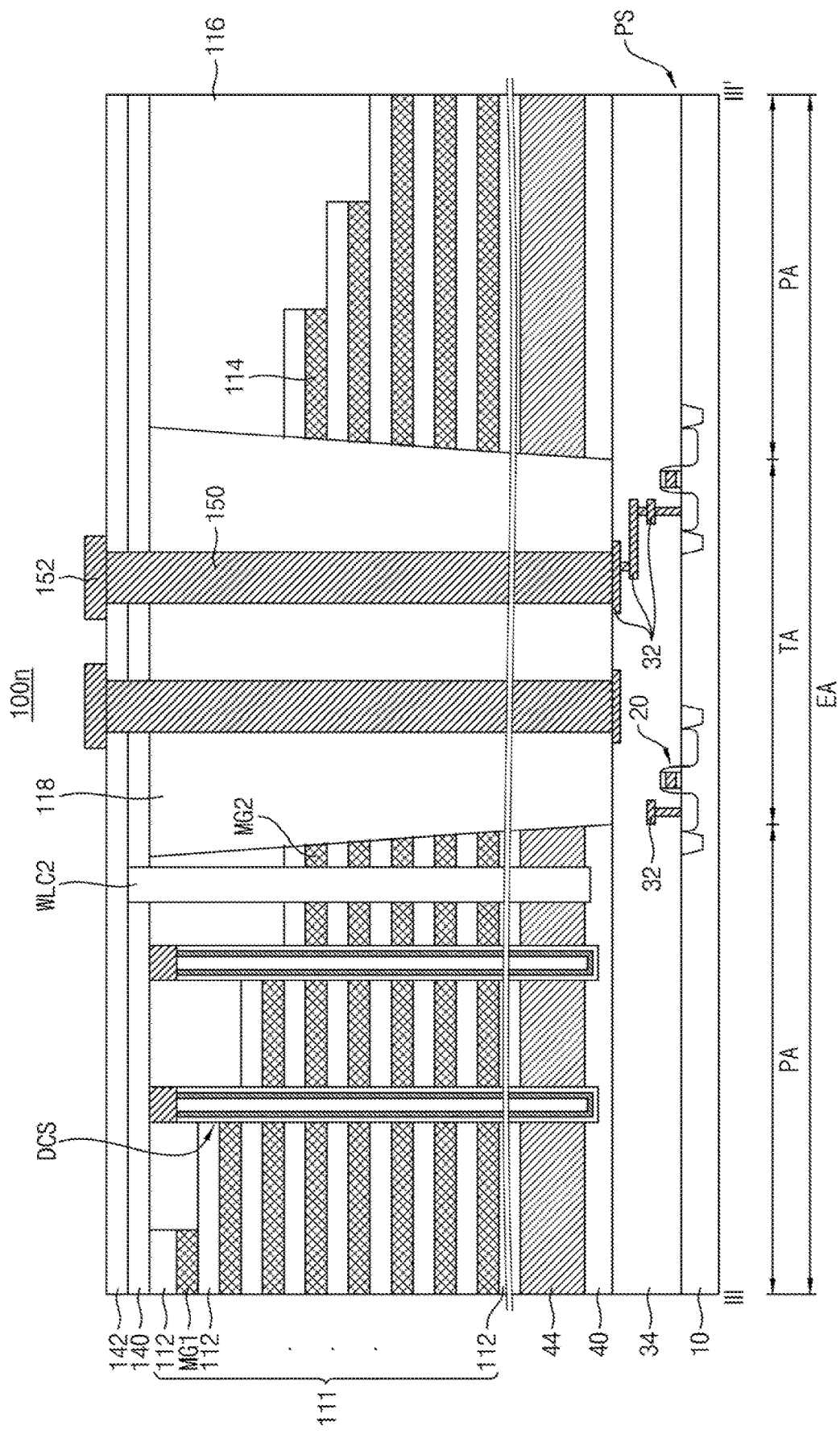

FIGS. 19 and 20 are vertical cross-sectional views of semiconductor devices taken along lines I-I', II-II' and III-III' according example embodiments.

Referring to FIGS. 19 and 20, a semiconductor device 100n may include a through electrode insulating layer 118 in the through electrode area TA and surrounding the through electrode 150. The through electrode insulating layer 118 may vertically penetrate the memory stack 111. In an implementation, the through electrode insulating layer 118 may vertically extend from an upper surface of the peripheral circuit structure PS to an upper surface of the memory stack 111. The through electrode 150 may vertically penetrate the through electrode insulating layer 118 to be connected to the peripheral circuit structure PS. The through electrode insulating layer 118 may electrically insulate the through electrode 150 from the first and second gate electrodes MG1 and MG2. In an implementation, the through electrode insulating layer 118 may include silicon oxide, silicon nitride, silicon oxynitride, or a combination thereof.

FIGS. 21 to 35 are plan views and vertical cross-sectional views of stages in a method of manufacturing a semiconductor device according to an example embodiment. FIGS. 21, 23, 25, 27, 31, and 33 are vertical cross-sectional views taken along lines I-I' and FIGS. 22, 24, 26, 28, 32 and 34 are vertical cross-sectional views taken along line FIGS. 29 and 35 are enlarged views of FIGS. 27 and 33, respectively.

Figure 21:
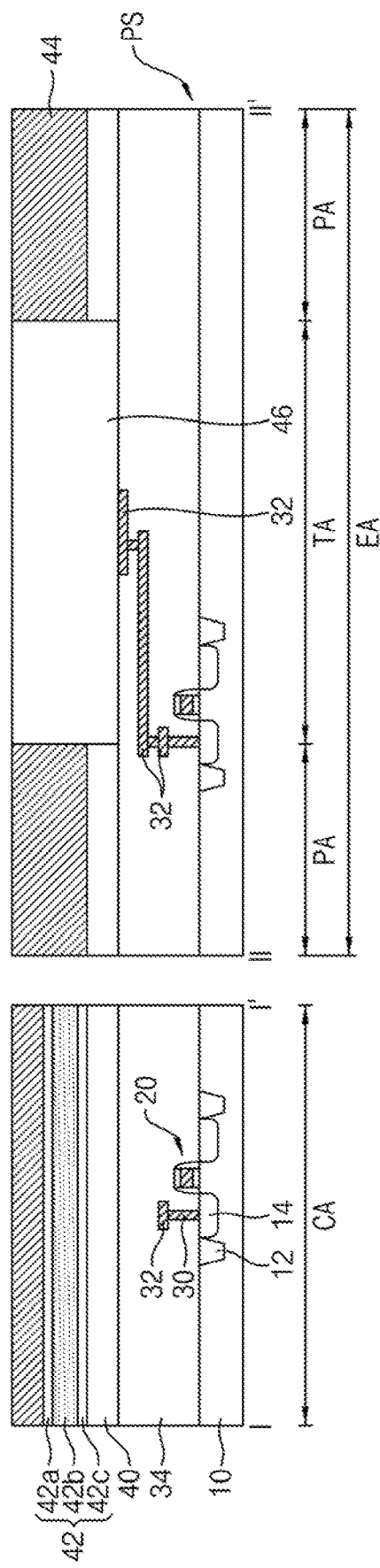
Figure 22:
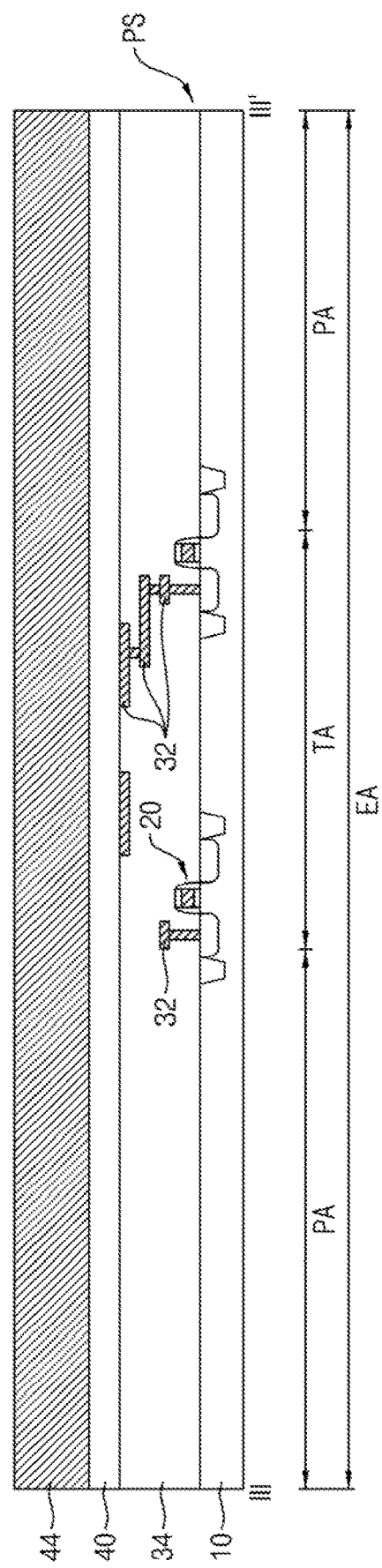

Referring to FIGS. 21 and 22, a substrate 10, a peripheral circuit structure PS, a lower conductive layer 40, a connection mold layer 42, a supporter 44, and a buried insulating layer 46 may be formed. The peripheral circuit structure PS may include a device isolation layer 12, an impurity region 14, a transistor 20, a contact plug 30, a peripheral circuit wire 32, and a peripheral insulating layer 34. The device isolation layer 12 and the impurity region 14 may be formed on or in an upper surface of the substrate 10. In an implementation, the device isolation layer 12 may include an insulating layer, e.g., silicon oxide or silicon nitride. The impurity region 14 may include an n-type impurity or a p-type impurity. The transistor 20 may be adjacent to the impurity region 14. The peripheral circuit wire 32 may be on the contact plug 30 and may be connected to the impurity region 14 via the contact plug 30. The peripheral insulating layer 34 may cover the transistor 20, the contact plug 30, and the peripheral circuit wire 32.

The lower conductive layer 40 may be on the peripheral circuit structure PS. The connection mold layer 42 may include a protective layer 42a and an insulating layer 42b on upper and lower surfaces of the protective layer 42a. The connection mold layer 42 may be on the lower conductive layer 40. The connection mold layer 42 may be formed by forming the protective layer 42a and the insulating layer 42b on the lower conductive layer 40, and then etching the protective layer 42a and the insulating layer so that the lower conductive layer 40 is partially exposed. In an implementation, the connection mold layer 42 may be in the cell array area CA and may not be in the extension area EA. In an implementation, the connection mold layer 42 may also be in the extension area EA. The supporter 44 may cover the exposed lower conductive layer 40 and the connection mold layer 42. The lower conductive layer 40 may include metal, metal nitride, metal silicide, metal oxide, conductive carbon, polysilicon, or a combination thereof. In an implementation, the lower conductive layer 40 may include a doped polysilicon layer. The connection mold layer 42 may include a material having an etch selectivity with the lower conductive layer 40, and the insulating layer 42b may include a material having an etch selectivity with the protective layer 42a. In an implementation, the insulating layer 42b may include silicon oxide, and the protective layer 42a may include silicon nitride. In an implementation, the supporter 44 may include polysilicon. The buried insulating layer 46 may be in the through electrode area TA. The buried insulating layer 46 may penetrate the lower conductive layer 40 and the supporter 44 to contact the peripheral insulating layer 34. In an implementation, the buried insulating layer 46 may include silicon oxide, silicon nitride, silicon oxynitride, low-k dielectric material, high-k dielectric material, or a combination thereof. In an implementation, the buried insulating layer 46 may include silicon oxide.

Figure 23:
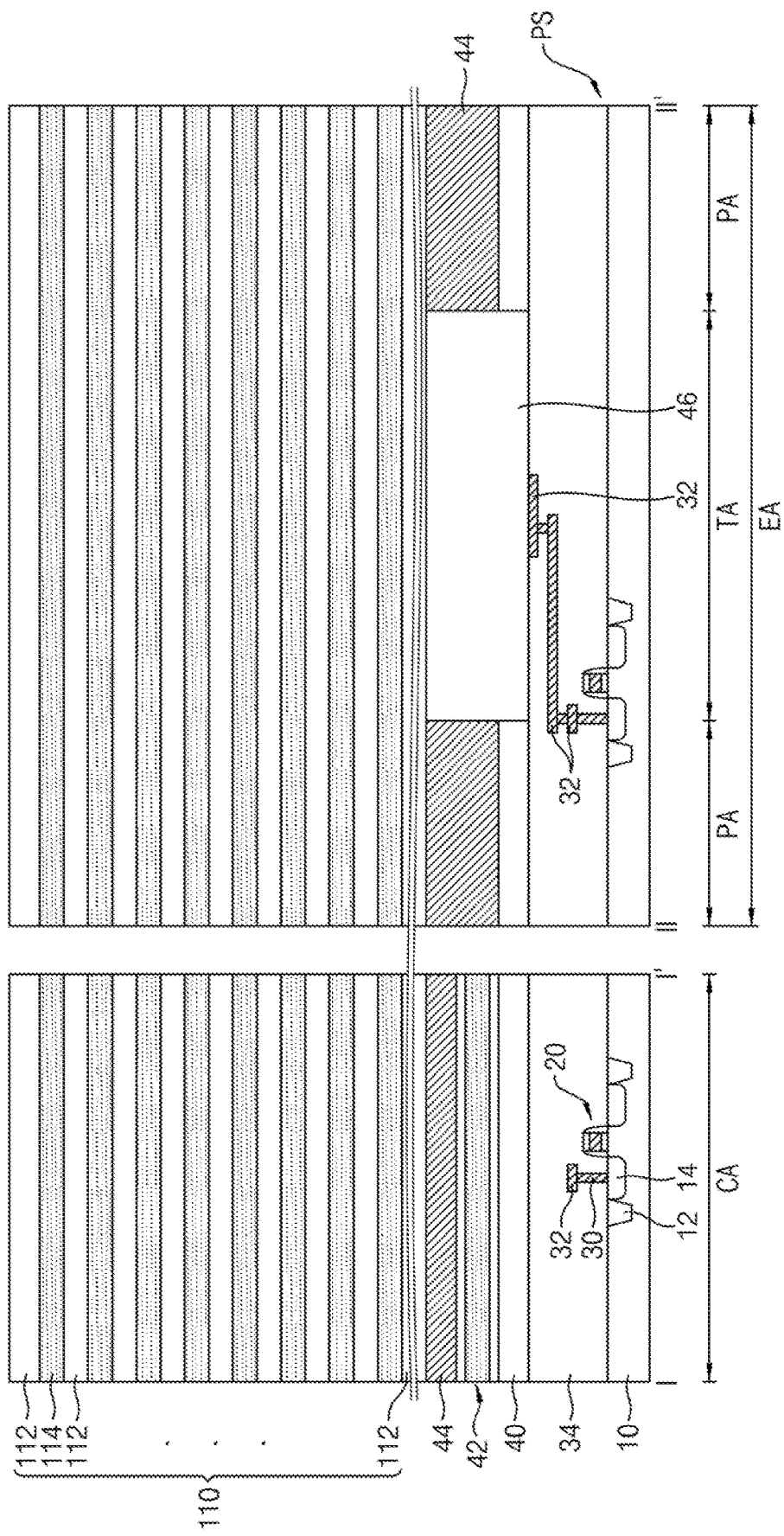
Figure 24:
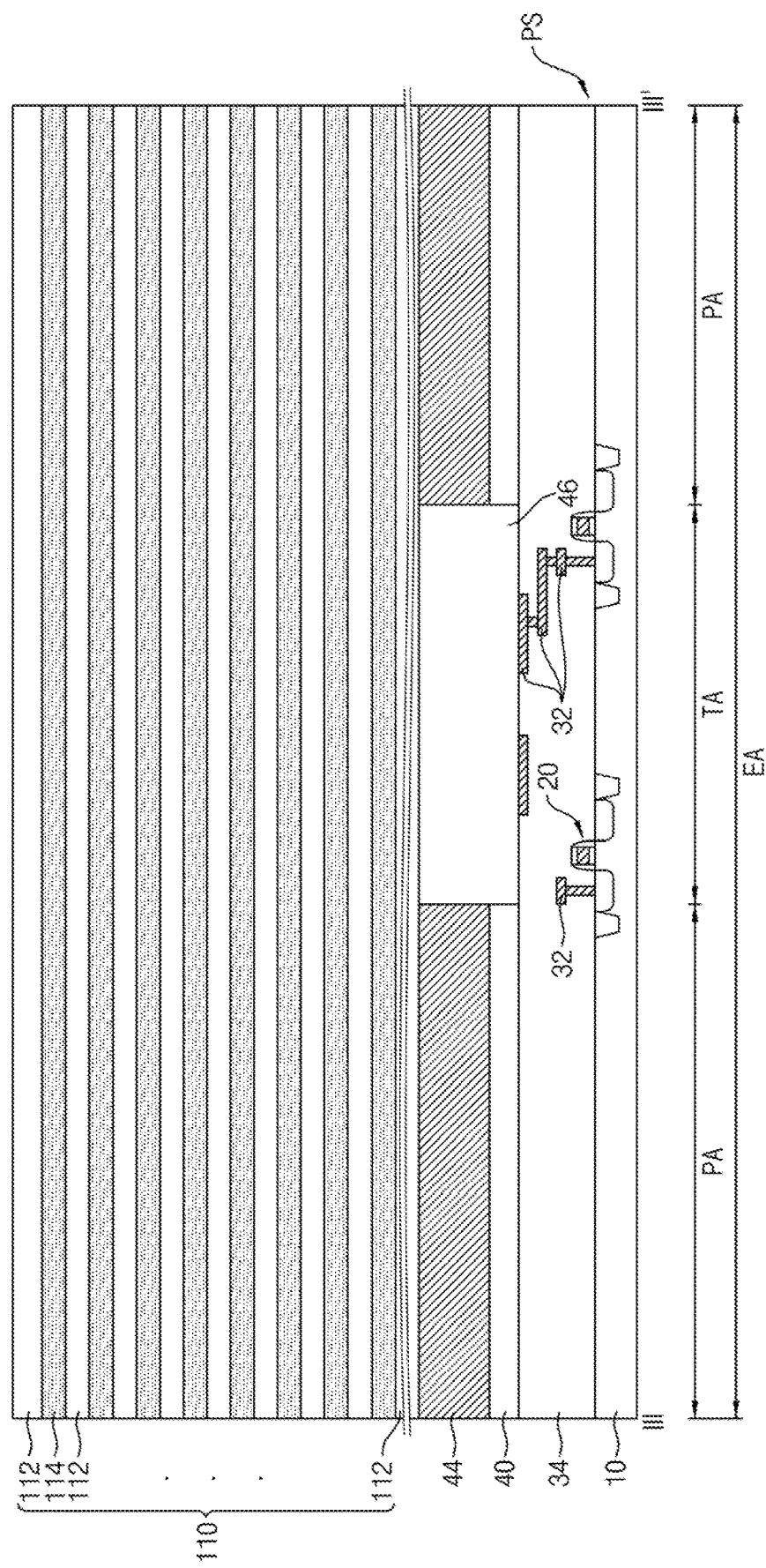

Referring to FIGS. 23 and 24, a mold stack 110 may be formed on the supporter 44. The mold stack 110 may include insulating layers 112 and mold layers 114 that are alternately stacked. In an implementation, the insulating layers 112 may include silicon oxide, and the mold layers 114 may include silicon nitride.

Figure 25:
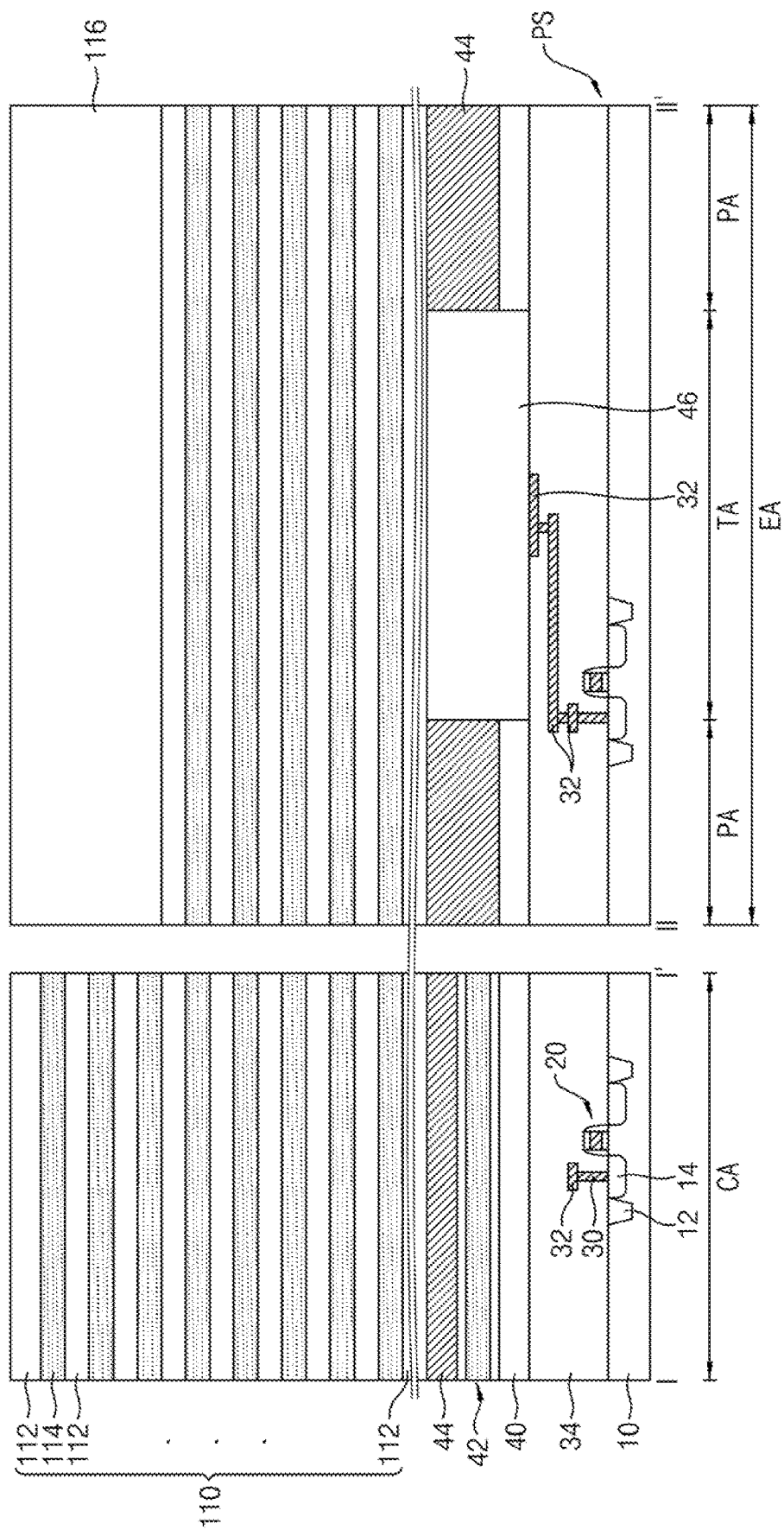
Figure 26:
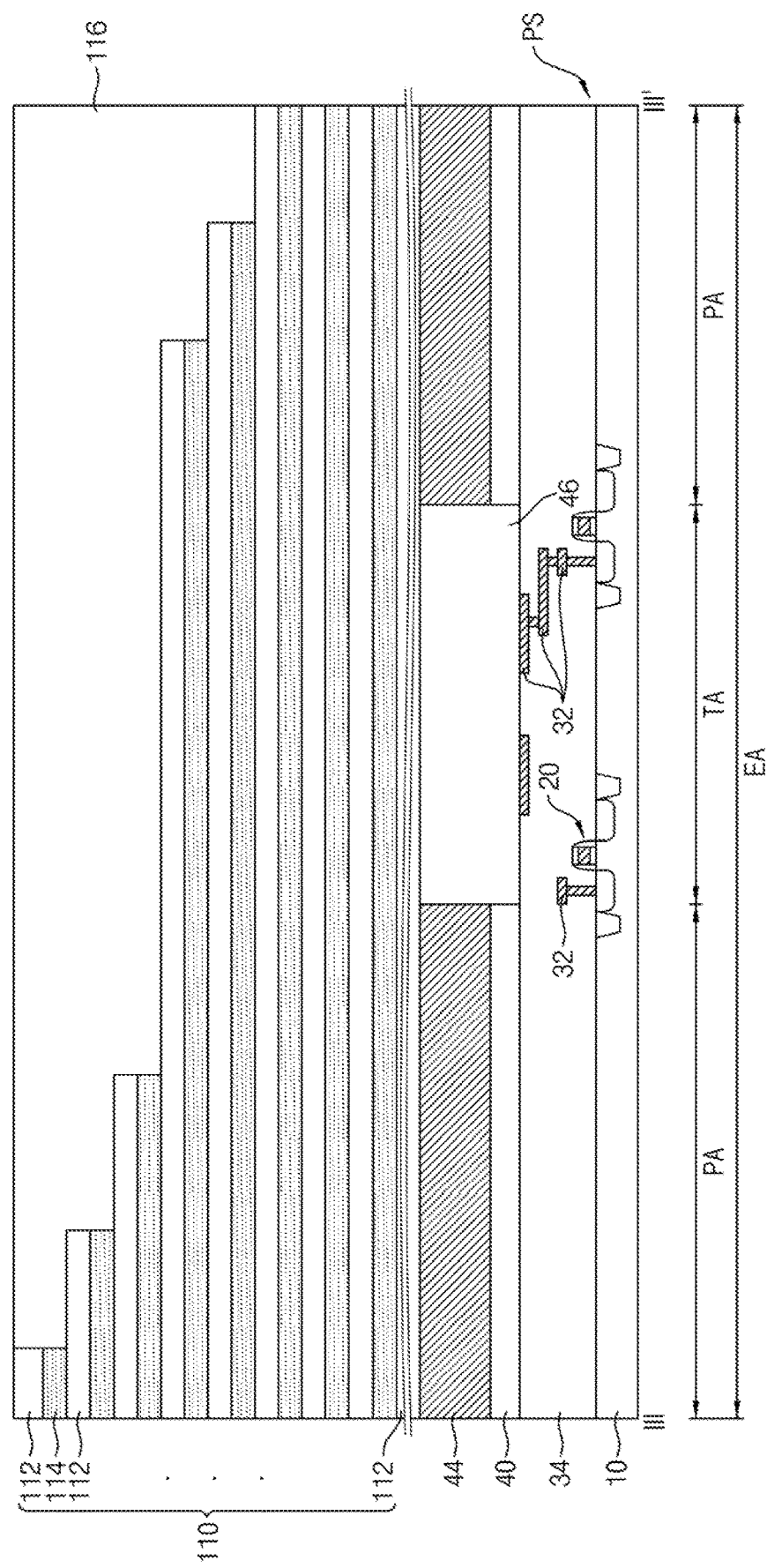

Referring to FIGS. 25 and 26, the mold stack 110 may be trimmed to have a staircase structure within the extension area EA. An interlayer insulating layer 116 covering the staircase structure may be formed. The interlayer insulating layer 116 may include silicon oxide, silicon nitride, silicon oxynitride, low-k dielectric, high-k dielectric, or a combination thereof. In an implementation, the interlayer insulating layer 116 may include silicon oxide.

Figure 28:
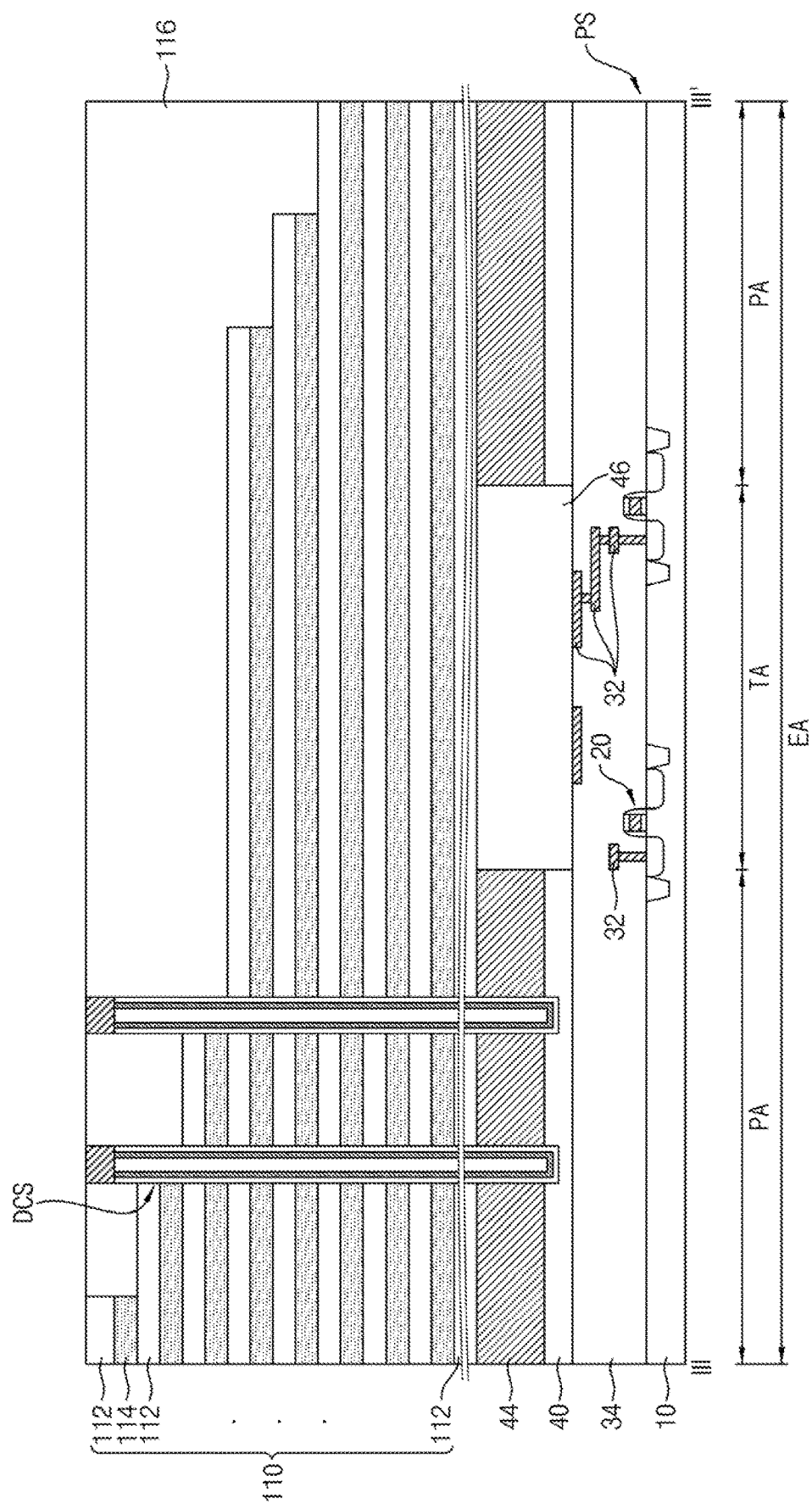
Figure 29:
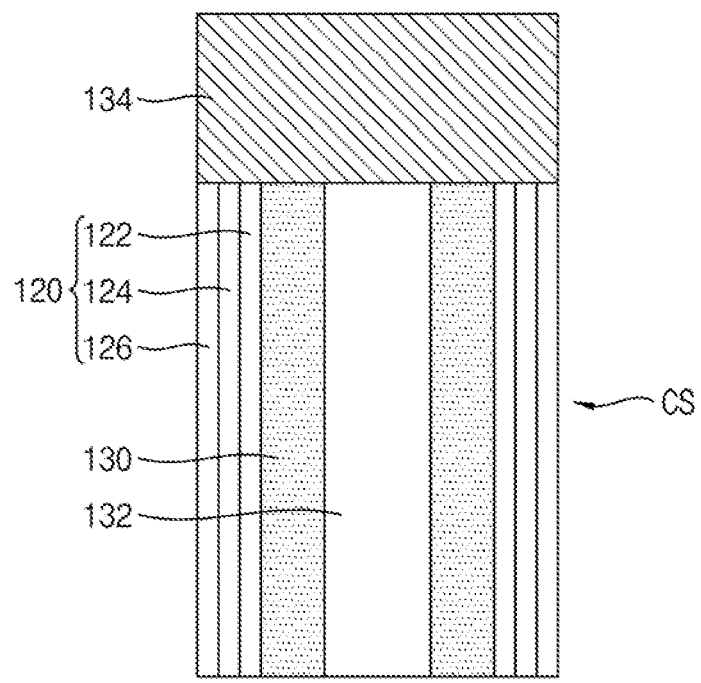

Referring to FIGS. 27, 28, and 29, channel structures CS and dummy channel structures DCS may be formed. The channel structures CS may be in the cell array area CA, and the dummy channel structures DCS may be in the extension area EA. Referring further to FIG. 29, the channel structure CS may include an information storage layer 120, a channel layer 130, and a buried insulating pattern 132. The channel layer 130 may be inside the information storage layer 120, and the buried insulating pattern 132 may be inside the channel layer 130. The information storage layer 120 may include a blocking layer 122, a charge storage layer 124, and a tunnel insulating layer 126. The charge storage layer 124 may be inside the blocking layer 122, and the tunnel insulating layer 126 may be inside the charge storage layer 124. In an implementation, the blocking layer 122 and the tunnel insulating layer 126 may include silicon oxide, and the charge storage layer 124 may include silicon nitride. The dummy channel structures DCS may have substantially the same structure as the channel structure CS. In an implementation, the dummy channel structure DCS may include an information storage layer 120, a channel layer 130, and a buried insulating pattern 132.

The conductive pad 134 may be formed on the channel structures CS. The conductive pad 134 may include a conductive layer, e.g., metal, metal nitride, metal oxide, metal silicide, conductive carbon, polysilicon, or combinations thereof.

Figure 30:
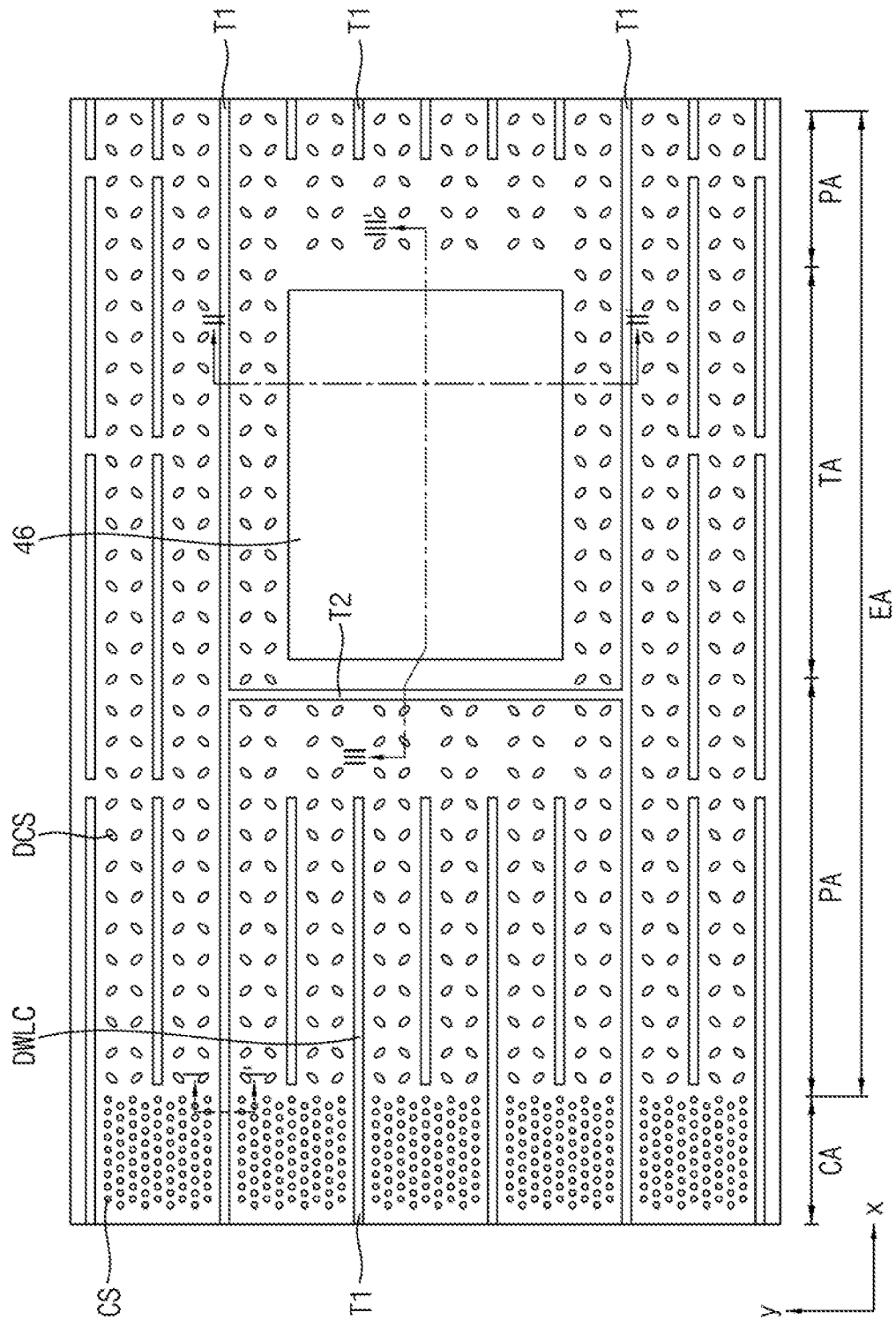
Figure 31:
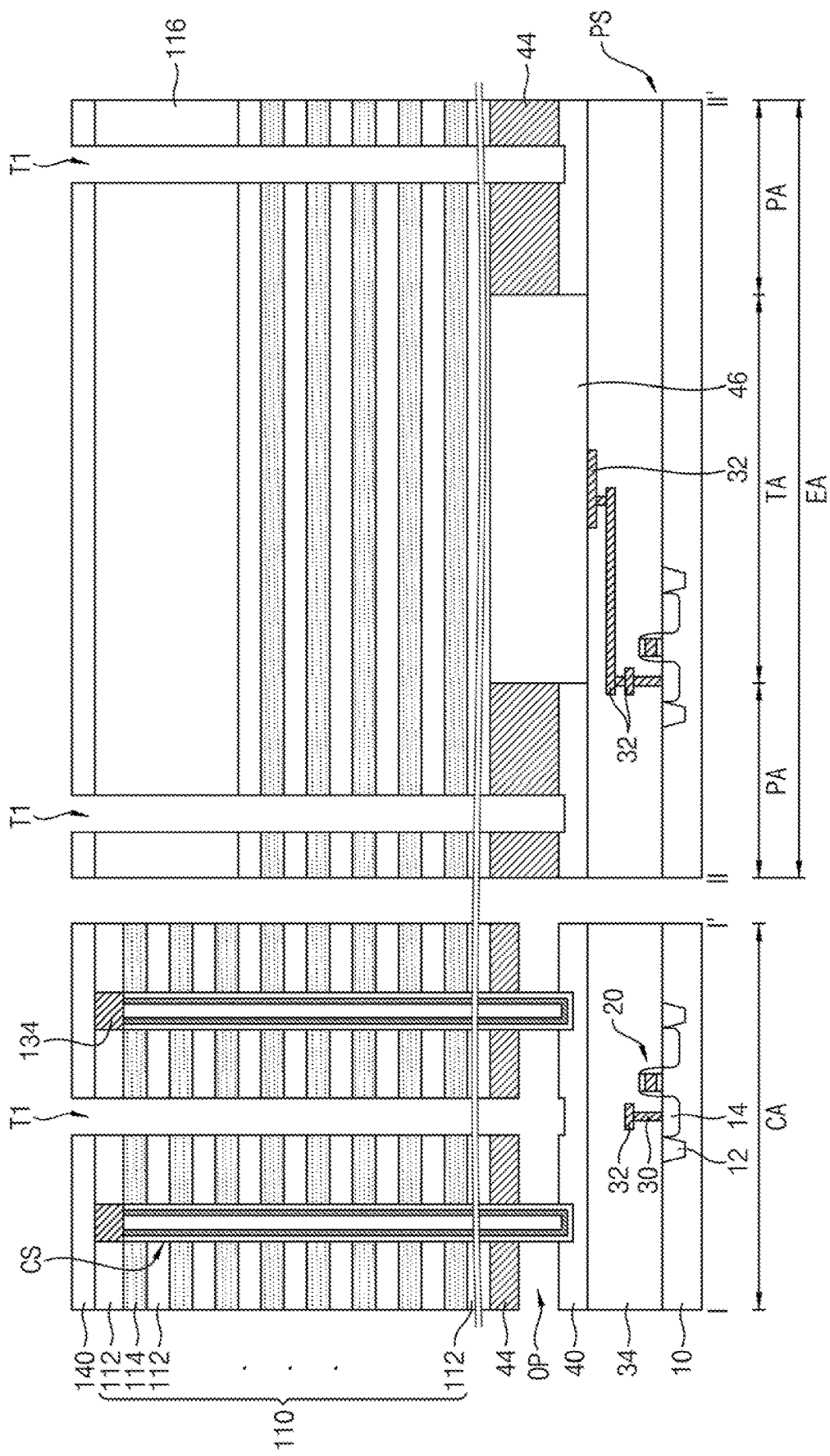
Figure 32:
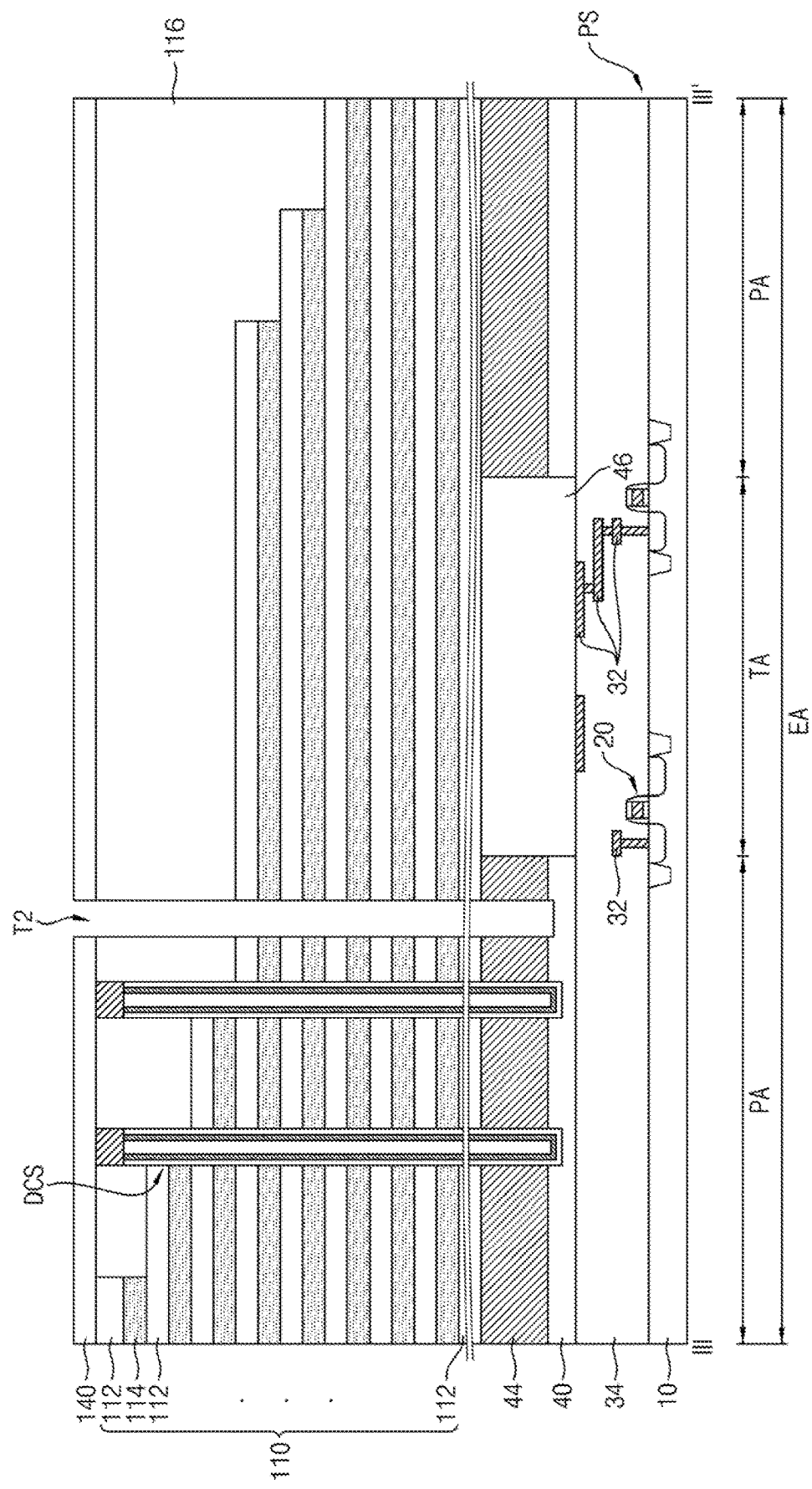

Referring to FIGS. 30, 31, and 32, a first upper insulating layer 140, a first isolation trench T1, and a second isolation trench T2 may be formed. The first upper insulating layer 140 may be on the mold stack 110 and may include silicon oxide, silicon nitride, silicon oxynitride, or a combination thereof. The first isolation trench T1 and the second isolation trench T2 may be formed by an anisotropic etching process and may vertically penetrate the mold stack 110. The first isolation trench T1 may extend in the first horizontal direction x in the cell array area CA and the extension area EA. The second isolation trench T2 may cross the first isolation trench T1 and may extend in the second horizontal direction y within the extension area EA. In an implementation, the second isolation trench T2 may extend in the second horizontal direction y between the through electrode area TA and the dummy channel structure DCS. The second isolation trench T2 may be integrally formed or continuous with the first isolation trench T1. The first isolation trench T1 and the second isolation trench T2 may expose the mold layers 114 of the mold stack 110. In an implementation, the plurality of second isolation trenches T2 may be formed to be spaced apart from each other in the first horizontal direction x.

The first isolation trench T1 may expose the connection mold layer 42, and the connection mold layer 42 may be selectively removed. Removing the connection mold layer 42 may include an isotropic etching process. The connection mold layer 42 may be removed, an opening OP may be formed between the lower conductive layer 40 and the supporter 44, and the channel structure CS may be partially exposed. When the connection mold layer 42 is removed, spacers for preventing etching of the mold stack 110 may be formed on side surfaces of the first and second isolation trenches T1 and T2.

Referring to FIGS. 30, 31, and 32, the second isolation trench T2 may be formed in the same step as the first isolation trench T1, so that the process can be simplified.

Figure 33:
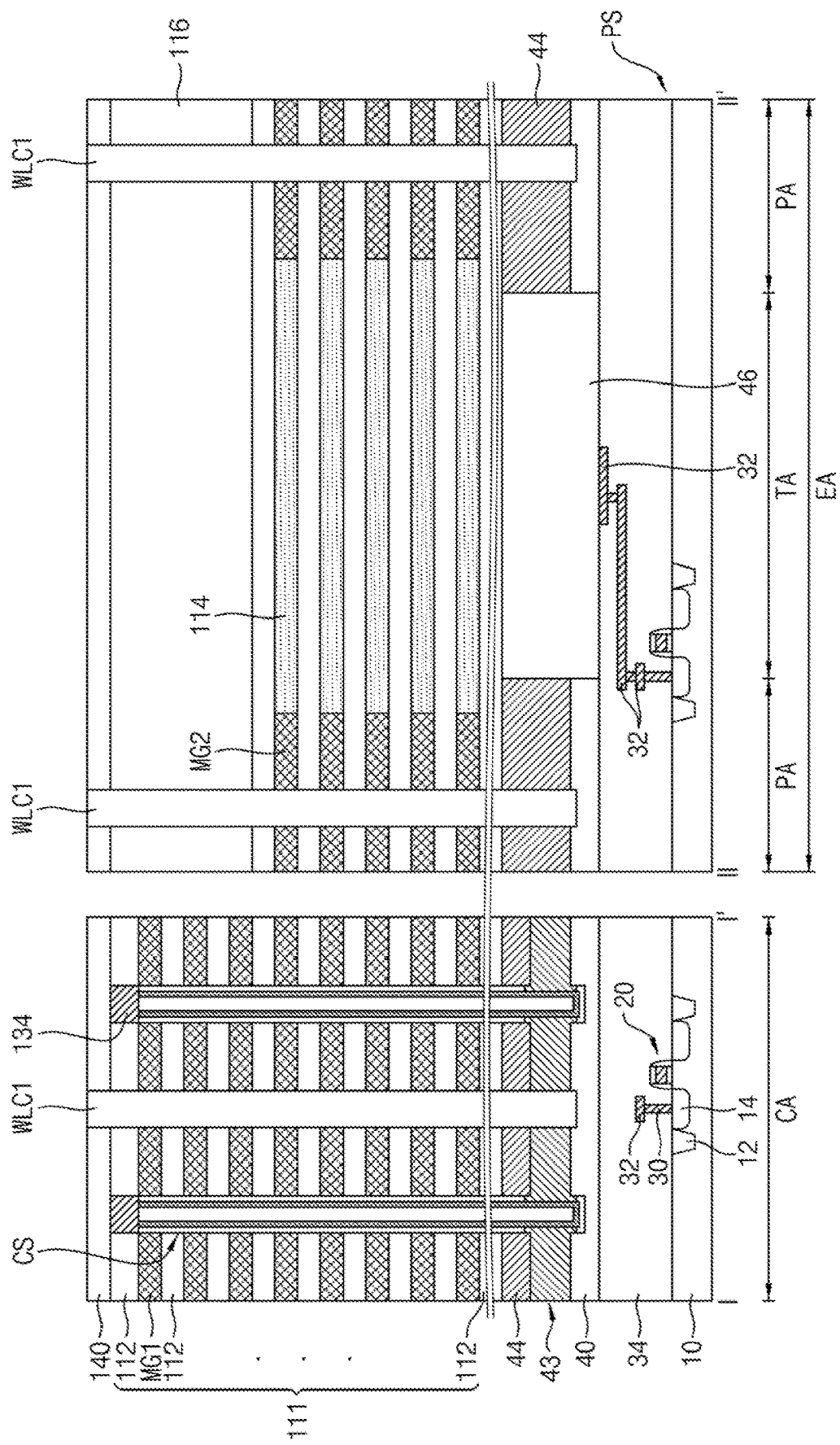
Figure 34:
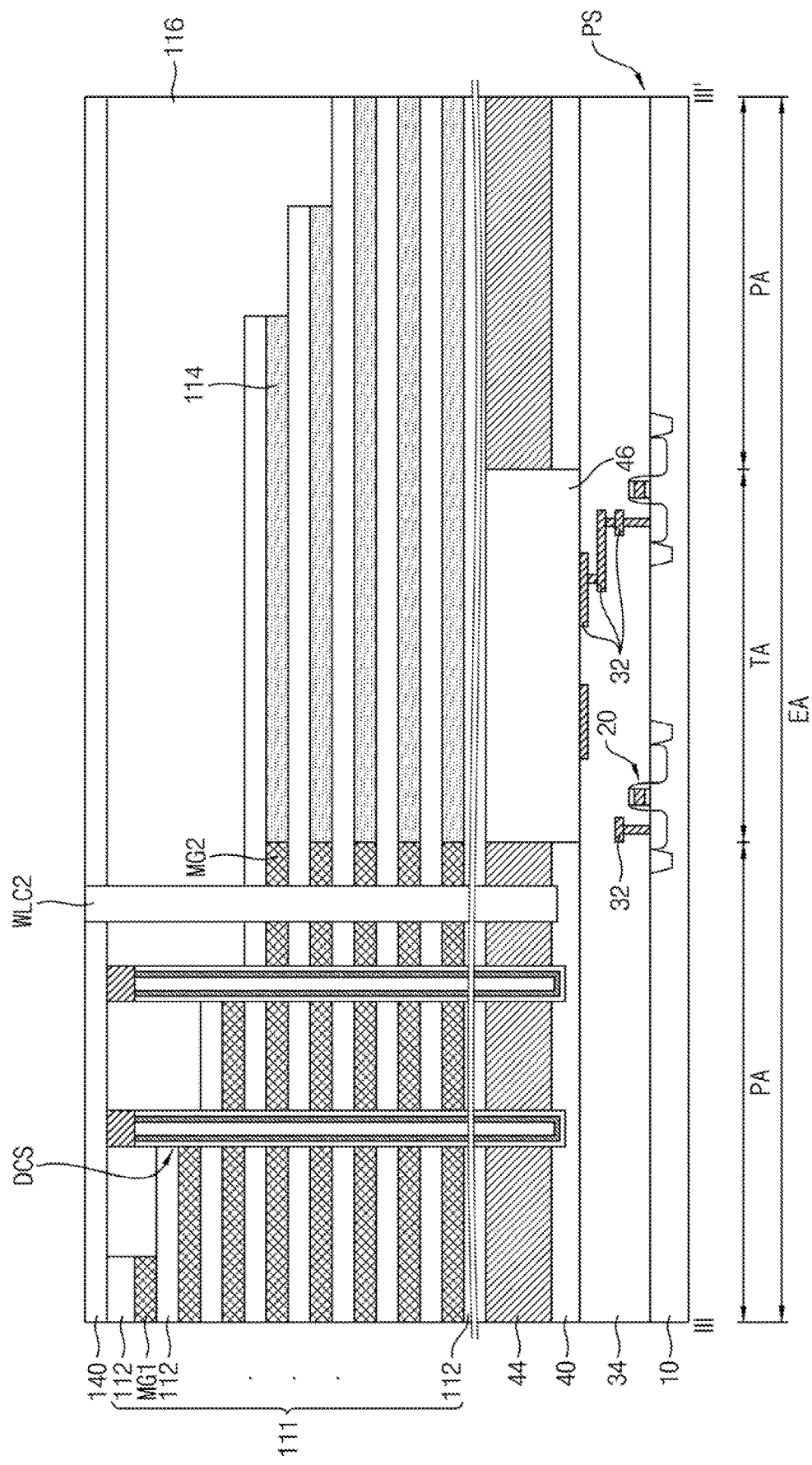
Figure 35:
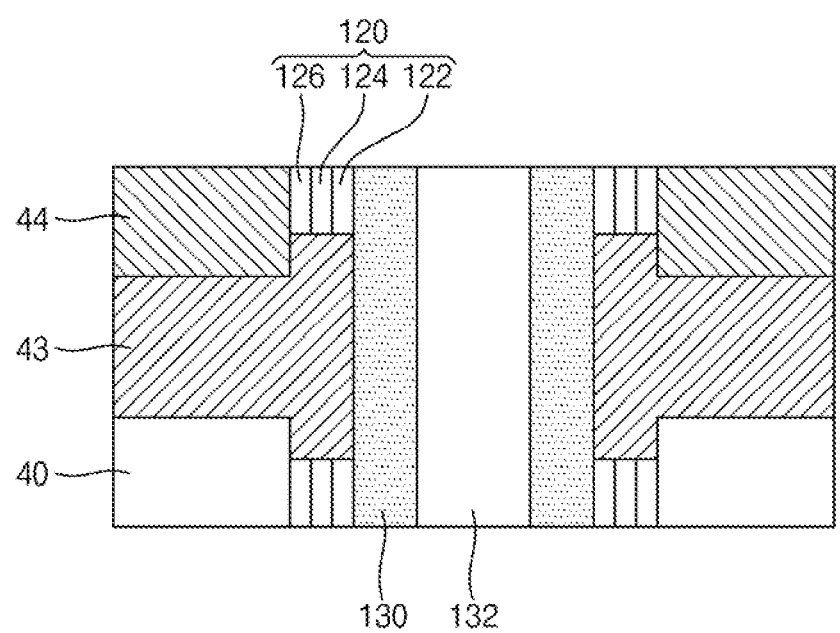

Referring to FIGS. 33, 34, and 35, a connection conductive layer 43, first gate electrodes MG1, second gate electrodes MG2, a first isolation insulating layer WLC1, and a second isolation insulating layer WLC2 may be formed. The connection conductive layer 43 may fill the inside of the opening OP. Forming the connection conductive layer 43 may include partially etching the information storage layer 120 to expose the channel layer 130 and filling a conductive material inside the opening OP so as to contact the channel layer 130. The connection conductive layer 43 may include metal, metal nitride, metal oxide, metal silicide, polysilicon, conductive carbon, or a combination thereof. In an implementation, the connection conductive layer 43 may include polysilicon. The connection conductive layer 43 may penetrate the information storage layer 120 and may contact a side surface of the channel layer 130. A portion of the connection conductive layer 43 in contact with the channel layer 130 may extend in a vertical direction.

After the mold layer 114 is removed, the first gate electrodes MG1 and the second gate electrodes MG2 may be formed in a space from which the mold layer 114 is removed. In an implementation, the first gate electrodes MG1 and the second gate electrodes MG2 may include tungsten. The process of removing the mold layer 114 may include an isotropic etching process. In an implementation, a portion of the mold layer 114 exposed by the first isolation trench T1 and the second isolation trench T2 may be removed horizontally toward the inner side of the mold stack 110. The first gate electrodes MG1 and the second gate electrodes MG2 may be alternately disposed with the insulating layer 112 and may constitute the memory stack 111. A portion of the mold layer 114 may not be removed in the extension area EA. In an implementation, the mold layer 114 may not be removed in the area surrounding the through electrode area TA.

The first isolation insulating layer WLC1 may be formed in the first isolation trench T1. The first isolation insulating layer WLC1 may vertically penetrate the first upper insulating layer 140, the memory stack 111, the supporter 44, and the connection conductive layer 43. The first isolation insulating layer WLC1 may be formed in the cell array area CA and the extension area EA. The second isolation insulating layer WLC2 may be formed in the second isolation trench T2. The second isolation insulating layer WLC2 may include the same material as the first isolation insulating layer WLC1. In an implementation, the first isolation insulating layer WLC1 and the second isolation insulating layer WLC2 may include silicon oxide, silicon nitride, silicon oxynitride, or a combination thereof. In an implementation, e.g., as described above, the first isolation insulating layer WLC1 and the second isolation insulating layer WLC2 may include tungsten.

As shown in FIG. 34, the second gate electrodes MG2 may be between the second isolation insulating layer WLC2 and the through electrode area TA. The second gate electrodes MG2 may be spatially and electrically separated from the first gate electrodes MG1 by the second isolation insulating layer WLC2. In an implementation, the second isolation insulating layer WLC2 may electrically insulate the first gate electrodes MG1 from the second gate electrodes MG2. Accordingly, even if word line bridging were to occur between the second gate electrodes MG2 in the periphery of the through electrode area TA, the operation of the memory cell by the first gate electrode MG1 may not be adversely affected.

Referring back to FIGS. 1, 2, and 3, a second upper insulating layer 142, a bit line plug 144, a bit line 146, a through electrode 150, and a connection wire 152 may be formed. The second upper insulating layer 142 may be formed on the first upper insulating layer 140. The bit line plug 144 may be formed through the first upper insulating layer 140 and the second upper insulating layer 142. The bit line 146 may be formed on the second upper insulating layer 142 and may be connected to the bit line plug 144.

The through electrode 150 may be formed in the through electrode area TA. The through electrode 150 may vertically penetrate the buried insulating layer 46, the memory stack 111, the interlayer insulating layer 116, the first upper insulating layer 140 and the second upper insulating layer 142, and may be connected to the peripheral circuit wire 32. The connection wire 152 may be formed on the second upper insulating layer 142. The connection wire 152 may be electrically connected to the peripheral circuit wire 32 through the through electrode 150.

The first upper insulating layer 140 and the second upper insulating layer 142 may include silicon oxide, silicon nitride, silicon oxynitride, or a combination thereof. The bit line plug 144, the bit line 146, the through electrode 150, and the connection wire 152 may include metal, metal nitride, metal oxide, metal silicide, polysilicon, conductive carbon, or a combination thereof.

By way of summation and review, a nonvolatile memory device may include gate electrodes and through electrodes. In such a device, shorting of the gate electrodes may occur.

One or more embodiments may provide a semiconductor device having a second isolation insulating layer crossing a first isolation insulating layer.

As is apparent from the above description, according to the example embodiments, the second isolation insulating layer crossing the first isolation insulating layer may electrically insulate the through electrode area from the cell array area, and it is possible to improve the reliability of a device regardless of whether word line bridging occurs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a cell array area and an extension area, the extension area including a through electrode area;
   a memory stack on the substrate and including first gate electrodes, insulating layers, and mold layers, the first gate electrodes and the insulating layers being sequentially stacked on the cell array area, and the mold layers including an insulating material and disposed on the through electrode area at a same level as the first gate electrodes;
   an interlayer insulating layer covering the memory stack;
   a channel structure vertically penetrating the first gate electrodes on the cell array area;
   a through electrode vertically penetrating the mold layers on the through electrode area;
   a pair of first isolation insulating layers vertically penetrating the memory stack, the pair of first isolation insulating layers continuously extending in a first horizontal direction from the cell array area to the extension area, the pair of first isolation insulating layers being spaced apart from each other in a second horizontal direction crossing the first horizontal direction, the pair of first isolation insulating layers respectively extending from the cell array area and continuously extending past the through electrode area along opposite sides of the through electrode area; and
   a second isolation insulating layer between the channel structure and the through electrode area and extending in the second horizontal direction and vertically penetrating the first gate electrodes and the interlayer insulating layer,
   wherein, in a plan view, the second isolation insulating layer is connected to the pair of first isolation insulating layers,
   wherein the through electrode area is disposed between the pair of first isolation insulating layers,
   wherein the second isolation insulating layer is adjacent to the through electrode area,
   wherein the mold layers are alternately stacked with the insulating layers on the through electrode area,
   wherein the through electrode is in contact with the mold layers, and
   wherein the second isolation insulating layer is spaced apart from the through electrode area and the mold layers and is in contact with the interlayer insulating layer.

2. The semiconductor device as claimed in claim 1, wherein upper surfaces of the pair of first isolation insulating layers are coplanar with an upper surface of the second isolation insulating layer.

3. The semiconductor device as claimed in claim 1, wherein:
   the memory stack further includes second gate electrodes at a same level as the first gate electrodes, the second gate electrodes being between the second isolation insulating layer and the through electrode, and
   the second isolation insulating layer electrically and spatially separates the first gate electrodes from the second gate electrodes.

4. The semiconductor device as claimed in claim 3, wherein the second gate electrodes are between the mold layers and the second isolation insulating layer.

5. The semiconductor device as claimed in claim 3, wherein a side surface of the second isolation insulating layer has a tapered shape.

6. The semiconductor device as claimed in claim 1, wherein the second isolation insulating layer is materially continuous with the pair of first isolation insulating layers.

7. The semiconductor device as claimed in claim 1, wherein a lower surface of an intersection region of the pair of first isolation insulating layers and the second isolation insulating layer is at a lower level than a lower surface of the pair of first isolation insulating layers and at a lower level than a lower surface of the second isolation insulating layer.

8. The semiconductor device as claimed in claim 1, wherein, in a plan view, an intersection region of the pair of first isolation insulating layers and the second isolation insulating layer includes a protrusion that protrudes convexly outward in the second horizontal direction.

9. The semiconductor device as claimed in claim 1, wherein, in a plan view, an intersection region of the pair of first isolation insulating layers and the second isolation insulating layer includes a depression that is depressed concavely inward in the second horizontal direction.

10. The semiconductor device as claimed in claim 1, wherein a lower surface of the second isolation insulating layer is at a higher level than a lower surface of the pair of first isolation insulating layers.

11. The semiconductor device as claimed in claim 1, further comprising dummy channel structures in the extension area and vertically penetrating the memory stack,
wherein the second isolation insulating layer is between the dummy channel structures.

12. A semiconductor device, comprising:
a substrate including a cell array area and an extension area, the extension area including a through electrode area;
a peripheral circuit structure on the extension area of the substrate;
a memory stack on the peripheral circuit structure, the memory stack including first gate electrodes, insulating layers, and mold layers, the first gate electrodes and the insulating layers being sequentially stacked on the cell array area, the mold layers including an insulating material and disposed on the through electrode area at a same level as the first gate electrodes, and second gate electrodes at a same level as the first gate electrodes;
an interlayer insulating layer covering the memory stack;
a channel structure vertically penetrating the first gate electrodes on the cell array area;
dummy channel structures vertically penetrating the first gate electrodes on the extension area;
a through electrode vertically penetrating the through electrode area;
a pair of first isolation insulating layers vertically penetrating the memory stack, the pair of first isolation insulating layers continuously extending in a first horizontal direction from the cell array area to the extension area, the pair of first isolation insulating layers being spaced apart from each other in a second horizontal direction crossing the first horizontal direction, the pair of first isolation insulating layers respectively extending from the cell array area and continuously extending past the through electrode area along opposite sides of the through electrode area; and
a second isolation insulating layer between the channel structure and the through electrode area and extending in the second horizontal direction and vertically penetrating the first gate electrodes and the interlayer insulating layer,
wherein, in a plan view, the second isolation insulating layer is connected to the pair of first isolation insulating layers, is between the dummy channel structures, and electrically and spatially separates the first gate electrodes from the second gate electrodes,
wherein the through electrode area is disposed between the pair of first isolation insulating layers,
wherein the second isolation insulating layer is adjacent to the through electrode area, wherein the mold layers are alternately stacked with the insulating layers on the through electrode area, and
wherein the second isolation insulating layer is spaced apart from the through electrode area and the mold layers and is in contact with the interlayer insulating layer.

13. The semiconductor device of claim 1, wherein, in a plan view, the second isolation insulating layer connects the pair of first isolation insulating layers to each other on a first side of the through electrode area, and the pair of first isolation insulating layers are separated on a second side of the through electrode area opposite the first side.

* * * * *